United States Patent
Tanaka et al.

(10) Patent No.: US 6,963,507 B2
(45) Date of Patent: Nov. 8, 2005

(54) NONVOLATILE MEMORY, SEMICONDUCTOR DEVICE, AND METHOD OF PROGRAMMING TO NONVOLATILE MEMORY

(75) Inventors: Toshihiro Tanaka, Akiruno (JP); Yutaka Shinagawa, Iruma (JP); Kazufumi Suzukawa, Ichikawa (JP); Masamichi Fujito, Kodaira (JP); Takashi Yamaki, Kodaira (JP); Kiichi Makuta, Kodaira (JP); Masashi Wada, Kodaira (JP); Yoshiki Kawajiri, Musashino (JP)

(73) Assignees: Renesas Technology Corp., Tokyo (JP); Hitachi ULSI Systems Co., Ltd., Tokyo (JP)

(*) Notice: Subject to any disclaimer, the term of this patent is extended or adjusted under 35 U.S.C. 154(b) by 0 days.

(21) Appl. No.: 10/419,228

(22) Filed: Apr. 21, 2003

(65) Prior Publication Data

US 2003/0206451 A1 Nov. 6, 2003

Related U.S. Application Data

(63) Continuation of application No. 09/964,394, filed on Sep. 28, 2001, now Pat. No. 6,567,313.

(30) Foreign Application Priority Data

Oct. 2, 2000 (JP) .......................... 2000-302696

(51) Int. Cl.[7] ............................... G11C 16/04

(52) U.S. Cl. ............................ 365/185.28; 365/185.22; 365/185.24; 365/185.18

(58) Field of Search ....................... 365/185.28, 185.22, 365/185.24, 185.18

(56) References Cited

U.S. PATENT DOCUMENTS

| | | | |
|---|---|---|---|
| 5,297,029 A | 3/1994 | Nakai et al. | 365/238.5 |
| 5,319,598 A | 6/1994 | Aralis et al. | 365/189.12 |
| 5,781,756 A | 7/1998 | Hung | 395/430 |
| 6,222,773 B1 * | 4/2001 | Tanzawa et al. | 365/185.28 |
| 6,392,932 B1 * | 5/2002 | Ishii et al. | 365/185.24 |
| 6,519,184 B2 * | 2/2003 | Tanaka et al. | 365/185.22 |
| 6,571,311 B2 * | 5/2003 | Kuwano | 711/103 |

FOREIGN PATENT DOCUMENTS

| | | |
|---|---|---|
| JP | 4-38700 | 2/1992 |
| JP | 5-62484 | 3/1993 |
| JP | 5-325574 | 12/1993 |

* cited by examiner

Primary Examiner—Connie C. Yoha
(74) Attorney, Agent, or Firm—Miles & Stockbridge P.C.

(57) ABSTRACT

Disclosed is a nonvolatile memory with a shortened total write time, capable of stably writing data by making a write current constant while reducing fluctuations in a voltage generated by a booster circuit. In a nonvolatile memory such as a flash memory, data is determined at the time of writing operation. While skipping a bit corresponding to write data having the logic "1" (or logic "0"), writing operation to bits corresponding to write data having the logic "0" (or logic "1") is successively performed.

9 Claims, 21 Drawing Sheets

NONVOLATILE MEMORY, SEMICONDUCTOR DEVICE, AND METHOD OF PROGRAMMING TO NONVOLATILE MEMORY

This application is a continuation of Ser. No. 09/964,394 filed Sep. 28, 2001, now a U.S. Pat. No. 6,567,313.

BACKGROUND OF THE INVENTION

The present invention relates to a technique effective for application to a method of applying a write voltage in an electrically erasable programmable nonvolatile memory, and a technique effective for use in a flash memory capable of erasing data in a lump, for example, on a block unit basis and a microcomputer having therein the flash memory.

A flash memory uses a nonvolatile memory cell taking the form of a MOSFET of a two-layer gate structure having a control gate and a floating gate, and a memory cell can be constructed by a single transistor. Conventional methods of writing data into a flash memory include a method of changing a threshold voltage by injecting or discharging charges to/from a floating gate by using an FN tunnel phenomenon by applying a voltage across the control gate and a substrate (what is called a well region) or across the control gate and a source or drain, and a method of changing a threshold voltage by passing a current between the source and the drain in a state where a high voltage is applied to the control gate and injecting hot electrons generated in a channel into the floating gate and discharging charges from the floating gate by using the PN tunnel phenomenon.

According to the writing method using the FN tunnel phenomenon, a write current is low, so that data can be written on a word line unit basis of, for example, 128 bytes. The method has an advantage such that data can be written in a lump. On the other hand, according to the writing method using hot electrons, a write current is high and it is difficult to write data in a lump on the word line unit basis, so that data is written on the basis of a unit such as one byte. It is difficult to reduce the size of a memory cell employing the writing method using the FN tunnel phenomenon in relation to a withstand voltage and the packing density does not therefore increased.

In any of the above writing methods, in many cases, data in a flash memory is erased on a block unit basis, that is, data in a plurality of sectors commonly using a well region is simultaneously erased.

SUMMARY OF THE INVENTION

The inventors herein have examined in detail a technique of shortening the write time in a flash memory employing the writing method using hot electrons. In the case of the writing method using hot electrons, a write voltage is applied to a memory cell only with respect to a bit of which write data is "0", and no write voltage is applied to a memory cell with respect to a bit of which write data is "1". The inventors got an idea of shortening the write time as a whole by skipping the writing operation on the bit of which write data is "1".

An example of a conventional method of shortening the write time in a flash memory employing the writing method using hot electrons is a method of overlapping write pulses by shifting a timing of writing data to a bit little by little (proposed in Japanese Unexamined Patent Application Nos. 5-62484, 5-325574, and 4-38700). By the method of shifting the write timing little by little, the write time becomes certainly shorter as compared with the method of sequentially writing data bit by bit. However, since the writing operation is performed (write cycle is included) even in the case where write data is "1" and it is unnecessary to apply a voltage, time is wasted. In addition, a write current largely fluctuates depending on a write data pattern, that is, whether there are many bits of "0" or not. Consequently, in the case where a booster circuit for generating a write voltage is provided on the inside, there is a problem such that a voltage generated by the booster circuit is vulnerable to fluctuations and a stable writing operation cannot be performed.

An object of the invention is to provide a nonvolatile memory with a shortened write time as a total and a semiconductor integrated circuit such as a microcomputer having therein the nonvolatile memory.

Another object of the invention is to provide a nonvolatile memory capable of performing a stable writing operation by making a write current constant and reducing fluctuations in a voltage generated by a booster circuit and a semiconductor integrated circuit such as a microcomputer having therein the nonvolatile memory.

The above and other objects and novel features of the invention will become apparent from the description of the specification and the appended drawings.

Representative ones of inventions disclosed in the application will be briefly described as follows.

In a nonvolatile memory such as a flash memory employing the writing method using hot electrons, data is determined at the time of writing operation. While skipping a bit corresponding to write data having the logic "1" (or logic "0"), the writing operation is successively performed on bits corresponding to write data having the logic "0" (or logic "1").

More concretely, a nonvolatile memory of the invention includes: a memory array having a plurality of word lines, a plurality of bit lines, and a plurality of nonvolatile memory cells, in which control terminals of nonvolatile memory cells in the same row are connected to a common word line, and data input/output terminals of the nonvolatile memory cells in the same column are connected to a common bit line; a data register for holding write data of the plurality of nonvolatile memory cells; and a write control circuit for applying a write voltage to the bit line in accordance with write data held in the data register. The nonvolatile memory is constructed to store data by changing a threshold voltage of the nonvolatile memory cell by applying the write voltage to the bit line. When a bit corresponding to write data held in the data register has logic "1" (or logic "0"), the write control circuit skips the bit and sequentially applies the write voltage to bit lines corresponding to the bit having the logic "0" (or logic "1").

According to the means, data is determined at the time of writing operation and the total write time can be shortened only by the write time of bits corresponding to the write data having the logic "1" (or logic "0"). Since the data writing operation is executed in each of the cycles, that is, there is no cycle in which the writing operation is not performed, as compared with the conventional method, fluctuations in the write current are reduced. Thus, the stable writing operation can be performed with suppressed fluctuations in the voltage generated by a booster circuit.

Desirably, the write voltage is applied in parallel to two or more bit lines to which the write voltage is to be applied. With the configuration, as compared with the method of writing data bit by bit, the total write time is shortened.

Preferably, the number of bit lines (the number of overlap write pulses) to which the write voltage is applied in parallel is constructed to be changeable. With the configuration, by changing the number of write voltages to be applied in parallel in accordance with variations in the circuit or the like, the capability of the booster circuit for generating the write voltage can be effectively used.

In the configuration, a register for setting a value for designating the number of bit lines to which the write voltage is applied in parallel is provided. With the configuration, only by setting the value of the register by the CPU or the like, the number of write voltages can be easily changed.

Further, application time per time of the write voltage is constructed to be changeable. With the configuration, by changing the application time of write voltages to be applied in parallel in accordance with the characteristics of the like of the memory cell, the optimum writing operation can be finished in the shortest time.

Preferably, the application time of the write voltage is determined on the basis of a clock signal, and the cycle of the clock signal is changed to thereby change the application time of the write voltage. Consequently, the change in the application time of the write voltage can be realized by the simple method of changing the cycle of the clock signal. More concretely, a variable frequency dividing circuit capable of generating the clock signals of different cycles on the basis of a reference clock signal and a register for setting a value of designating a frequency dividing ratio in the variable frequency dividing circuit are provided. By changing the frequency driving ratio, the cycle of the clock signal is changed. With the configuration, the nonvolatile memory capable of easily changing the application time of the write voltage can be realized. A value set in the register for setting the value of designating the number of bit lines to which the write voltage is applied in parallel and a register for setting a value of designating the frequency dividing ratio in the variable frequency dividing circuit may be stored in a predetermined memory cell in the nonvolatile memory.

Further, a shift register for sequentially outputting the write voltage on the basis of the clock signal and write data held in the data register is provided. With the configuration, only by setting the value of the register by the CPU or the like, the application time of the write voltage can be easily changed.

The shift register is constructed to perform a shifting operation synchronously with one of two clock signals of phases different from each other, the clock signal to be supplied is switched between the two clock signals in accordance with the write data held in the data register and, when the bit of the write data has the logic "1" (or logic "0"), the bit is skipped, and the write voltage is sequentially applied to bit lines corresponding to a bit having the logic "0" (or logic "1").

Alternately, the shift register includes a through path and a shift path for each of shift stages and switching means for switching the path between the through path and the shift path and performs a shifting operation synchronously with the clock signal, the switching means switches the path between the through path and the shift path in accordance with the write data held in the data register and, when the bit of the write data has the logic "1" (or logic "0"), the bit is skipped and the write voltage is sequentially applied to bit lines corresponding to a bit having the logic "0" (or logic "1").

Further, distributing means is provided between the shift register and the bit line, for enabling the write voltage to be applied to one of a plurality of bit lines on the basis of an output signal of each of the shift stages of the shift register. The data register can hold write data of the number of bits corresponding to the number of bit lines and, between the shift register and the shift register, selecting means for selecting one of the plurality of bits of the data register and supplying the selected bit to any of the shift stages of the shift register is provided. With the configuration, each of the stages of the shift register can be shared by the plurality of bit lines. Thus, by decreasing the number of stages of the shift register, the circuit is simplified and the layout is facilitated.

Further, the write voltage is applied once to the plurality of bit lines. After completion of the writing operation on a plurality of memory cells connected to one word line, for verification, data is read from a memory cell connected to the word line including the memory cell on which the writing operation has been performed. When a memory cell on which the writing operation has not been performed yet exists, the write voltage is sequentially applied only to the bit line to which the memory cell on which the writing operation has not been performed yet is connected for a time different from an application time of the write voltage applied in the preceding writing operation.

Alternately, the data reading operation for verification is performed. After that, when the memory cell on which the writing operation has not been performed yet is found, a write voltage different from the write voltage applied in the preceding writing operation is sequentially applied to the bit line to which the memory cell on which the writing operation has not been performed yet is connected. By the operation, the threshold can be prevented from being largely changed more than required due to excessive writing operation.

Preferably, when the memory cell on which the writing operation has not been performed yet is found by the data reading operation for verification, a write voltage different from the write voltage applied in the preceding writing operation is sequentially applied to the bit line to which the memory cell on which the writing operation has not bee performed yet is connected, and the number of write voltages to be applied in parallel to the plurality of bit lines is changed from that in the preceding writing operation.

DETAILED DESCRIPTION OF THE INVENTION

Figure 1:
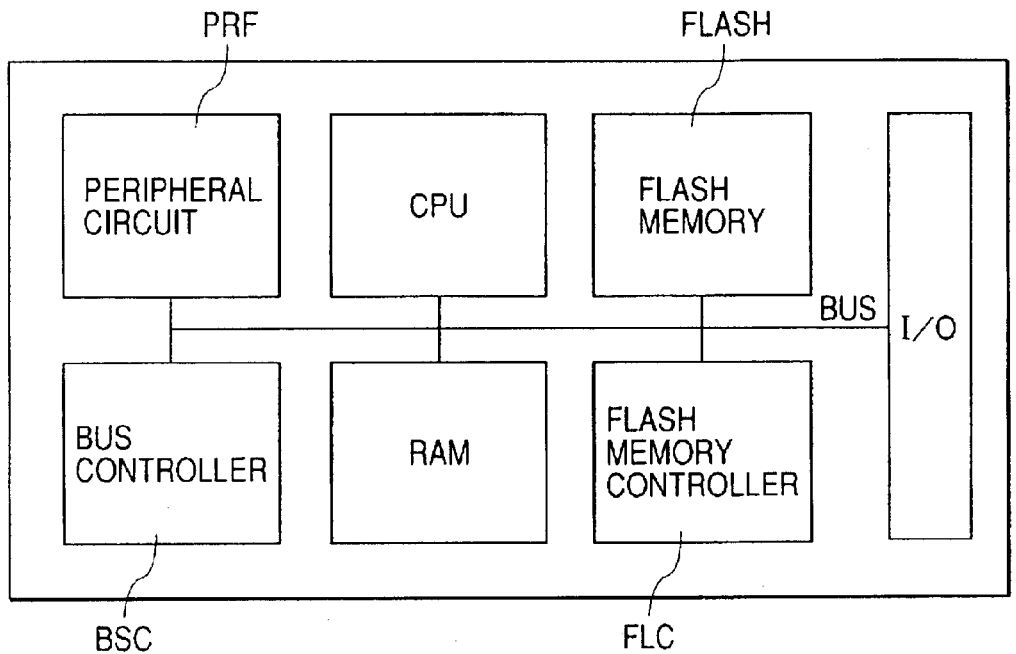
FIG. 1 is a general block diagram showing an outline of an embodiment of a microcomputer having therein a flash memory to which the invention is applied.

Embodiments of the invention will be described herein below with reference to the drawings. FIG. 1 shows a schematic configuration of a microcomputer having therein a flash memory to which the invention is applied (herein below, called a flash memory integrated microcomputer). Although not limited, circuit blocks shown in FIG. 1 are formed on a single semiconductor chip made of single crystal silicon or the like.

Shown in FIG. 1 are: a flash memory FLASH having a memory array in which memory cells each constructed by an MOSFET having a control gate and a floating gate are arranged in a matrix; a flash controller FLC for writing and erasing data to/from the flash memory; a central processing unit CPU for controlling the whole chip; a random access memory RAM for temporarily storing data and providing a work area of the central processing unit CPU; a peripheral circuit PRP such as various timers, an A/D converter, and a watchdog timer for monitoring the system; an internal bus BUS for connecting the central processing unit CPU, flash memory FLASH, flash controller FLC, and RAM; an interface circuit I/O including an input/output port such as a serial communication port for performing serial communication with an input/output buffer or an external device for outputting a signal on the internal bus BUS to an external bus or capturing a signal on the external bus; and a bus controller BSC for controlling occupancy of the internal bus BUS, and the like.

Although not shown in FIG. 1, other than the circuit blocks, an interruption control circuit for generating an interruption request to the CPU, determining the priority, and making an interruption, a DMA transfer control circuit for controlling DMA (Direct Memory Access) transfer between the RAM and the flash memory FLASH or the like, an oscillator for generating a clock signal necessary for the operation of the system, and the like may be provided as necessary.

Figure 2:
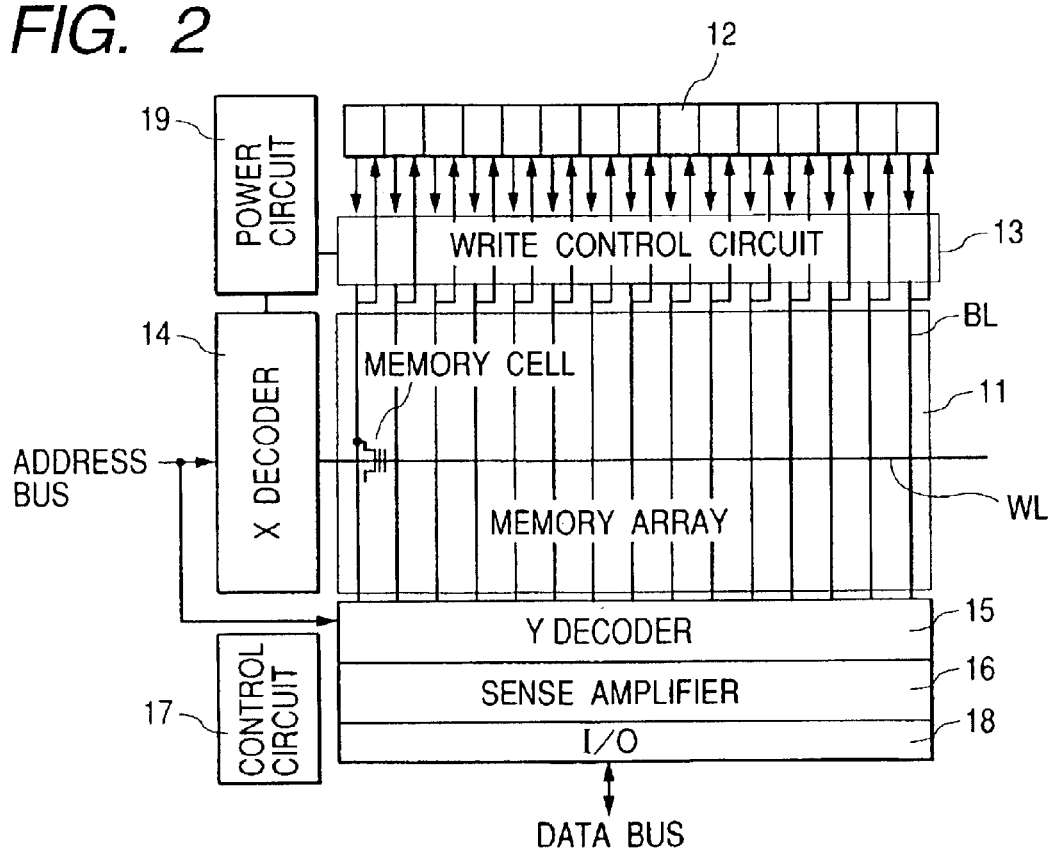
FIG. 2 is a block diagram showing an example of the configuration of a circuit portion of the flash memory to which the invention is applied.

FIG. 2 shows a schematic configuration of the flash memory FLASH. Shown in FIG. 2 are a memory array 11 in which memory cells as nonvolatile memory cells each taking the form of a MOSFET having a control gate CG and a floating gate FG as shown in FIG. 4B are arranged in a matrix, a data register 12 for holding write data input from the outside, of the number of bits corresponding to the number of memory cells connected to one word line such as 128 bytes, and a write control circuit 13 for performing writing operation on the memory array 11 on the basis of the data held in the data register 12. The data register 12 does not have to hold data of the number of bits corresponding to the number of memory cells in the word direction, that is, the number of bit lines in the memory array 11 but may hold data of a fraction of the integer and supply the data to corresponding one of a plurality of bit lines via a selector (demultiplexer).

The flash memory FLASH further includes: an X decoder 14 for decoding an X address signal captured via the address bus and selecting one of the word lines in the memory array 11, which corresponds to the X address; a Y decoder 15 for decoding a Y address signal captured via the address bus and selecting data of one byte (or one word) in a sector; and a sense amplifier 16 for amplifying data read on a bit line in memory cell array 11.

The flash memory FLASH of the embodiment includes not only the above circuit blocks but also: a control circuit 17 for generating control signals to the circuit blocks in the flash memory on the basis of control signals from the outside; an I/O buffer 18 for inputting/outputting a data signal between the sense amplifier 16 and a data bus; and a power circuit 19 for generating voltages necessary in the chip such as a write voltage, an erase voltage, a read voltage, and a verification voltage on the basis of a source voltage Vcc supplied from the outside, selecting a desired voltage from the voltages in accordance with an operating state of the memory, and supplying the selected voltage to the write control circuit 13 and X decoder 14.

The flash controller FLC has, for example, a control register. When the CPU operates according to a program stored in the flash memory or RAM and writes data into the control register, the flash controller FLC generates a control signal to the flash memory FLASH in accordance with the bit state of the control register to perform an operation such as writing, erasing, reading, or verifying.

The flash controller FLC may be provided with, other than the control register for writing/erasing control, an erasure block selecting register for selecting a block from which data is erased out of the plurality of blocks in the memory array at the time of erasing operation, a register for setting a value for trimming a voltage, and a register for holding repair information for replacing a memory column including an error bit in the memory array with a spare memory column. Although not particularly limited, the value of the register for trimming is stored in a predetermined area in the flash memory FLASH, read from the flash memory FLASH at the time of reset, and set into the register for trimming.

Figure 3:
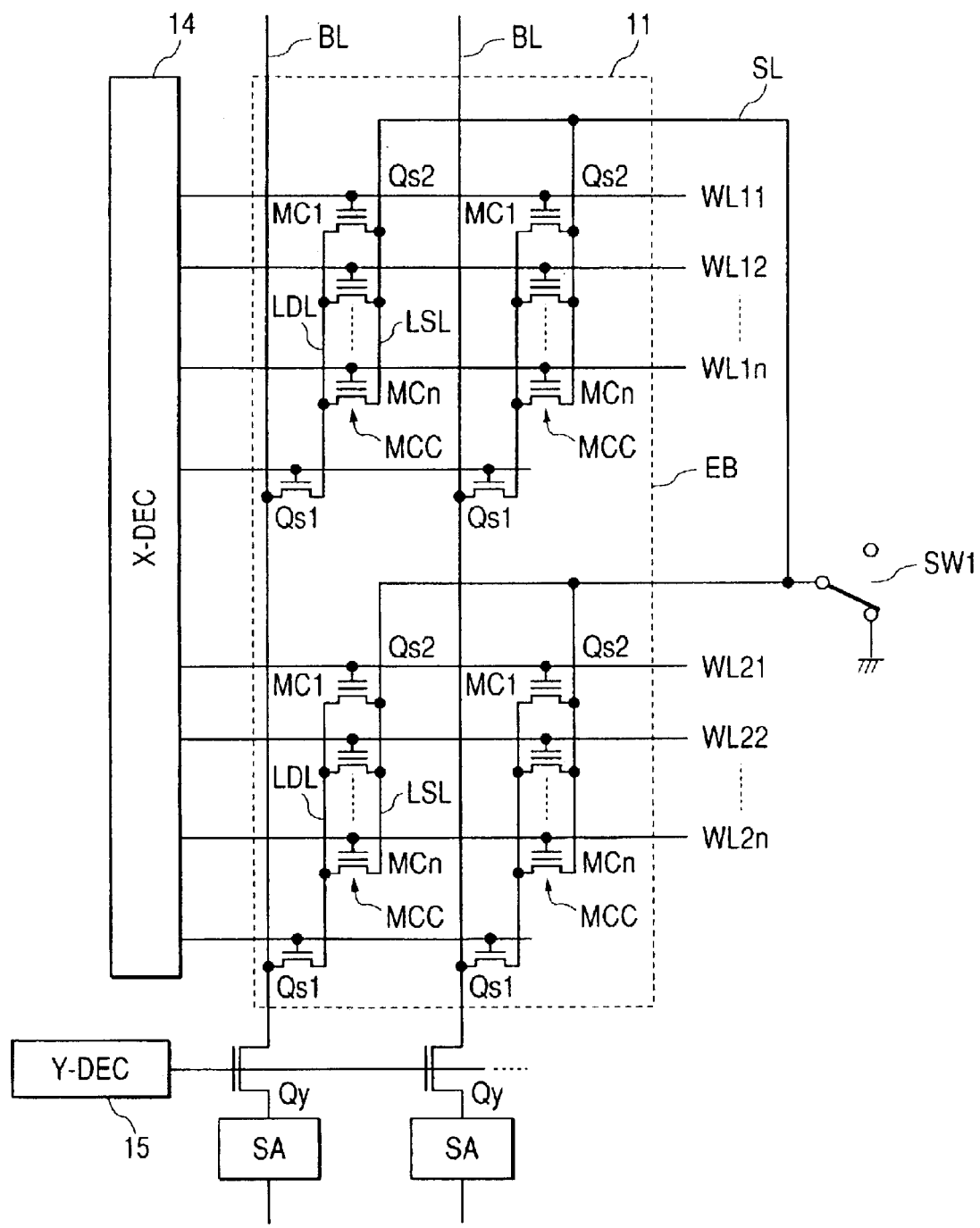
FIG. 3 is a circuit diagram showing a concrete example of the configuration of a memory array in the flash memory.

FIG. 3 shows a concrete example of the configuration of the memory array 11. In the memory array 11 of the embodiment, as shown in FIG. 3, a plurality of memory columns MCC each consisting of (n) memory cells MC1 to MCn are arranged in the row direction (word line WL direction) and the column direction (bit line BL direction). The memory cells MC1 to MCn (each of which is a MOSFET having a control gate and a floating gate) are arranged in parallel in the column direction. The sources and drains of the memory cells MC1 to MCn are commonly connected. FIG. 3 shows representative four memory columns MCC out of the plurality of memory columns MCC.

In each of the memory columns MCC, the drains and sources of the (n) memory cells MC1 to MCn are connected to a common local drain line LDL and a common local source line LSL, and the local drain line LDL is connected to a bit line BL via a selection switch MOSFET Qs1. Further, the local source line LSL is connected to a common source line SL, and the common source line SL is constructed so as to be connectable to a ground potential via a change-over switch SW1. When the switch SW1 is turned off, the source of the memory cell is opened via the common source line SL.

In the flash memory of the embodiment, the memory cells connected to common source line SL construct a block EB and are formed in a common well region in a semiconductor substrate, as a unit of erasing operation. The control gates of the memory cells MC arranged in the lateral direction, that is, the row direction are connected to common word lines WL11, WL12, ..., WL1n, WL21, WL22, ..., and WL2n on a row unit basis. For example, 128×8 memory cells connected commonly to one word line construct one sector which is the unit of writing operation.

A sense amplifier SA is connected to each bit line BL via a column switch Qy which is turned on/off by a selection signal of the Y decoder 15. At the time of reading data, the word line WL is set to the selection level, the potential of the bit line BL of which memory cells change according to whether a drain current flows or not is amplified by the sense amplifier SA, and the amplified potential is detected. At the time of writing data, by the write control circuit 13, a write voltage is applied to the drain of the memory cell selected by the word line via the bit line BL and further the local drain line LDL in accordance with the data held in the data register 12.

At the time of writing operation, one word line corresponding to the supplied address is selected, and a write voltage such as 10V is applied. At this time, according to a bit corresponding to the write data, when the bit indicates the logic "0", a voltage such as 5V is applied to the bit line BL. When the bit indicates the logic "1", 0V is applied. In a memory cell where the potential of the local drain line LDL is 5V, hot electrons generated when the drain current flows are injected to the floating gate and the threshold voltage is set to the high state (logic "0"). On the other hand, in a memory cell where the potential of the bit line BL is 0V, charges are not injected to the floating gate, and the threshold voltage remains low (logic "1").

A the time of erasing data, all of word lines in one block EB are set to a potential such as −11V. In each of memory cells connected to the word lines, the selection switch MOSFET Qs1 on the drain side is turned off to make the drain open, and the change-over switch SW1 on the source side is turned off to make the source open. A voltage such as 10V is applied to the well region. By the operations, in each of all the memory cells in one block, charges are moved from the floating gate to the well region, and the threshold voltage is set to the low state (logic "1").

At the time of reading data, all bit lines BL are precharged to a potential Vpc such as 1.0V, one word line corresponding to the supplied address is selected, and a voltage such as a source voltage (for example, 3.3V) is applied. The change-over switch SW1 on the source side is switched to the ground potential side, and 0V is applied to the local source line LSL via the common source line SL. In each of the memory cells connected to the selected word line, when the threshold voltage is low, a current flows and the potential of the bit line BL decreases. When the threshold voltage is high, a current does not flow, so that the potential of the bit line BL is maintained at the precharge level. The potential is amplified and detected by the sense amplifier SA.

Figure 4A:
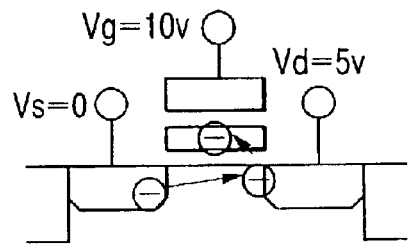
FIGS. 4A to 4C are diagrams showing a representative structure of a memory cell in the flash memory and an example of application voltages at the time of writing, erasing, and post-erasing operations.
Figure 4B:
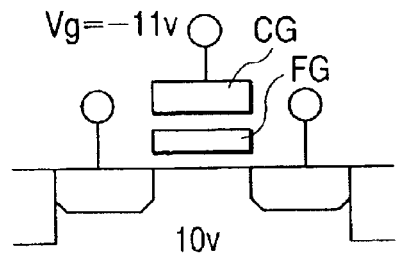
Figure 5:
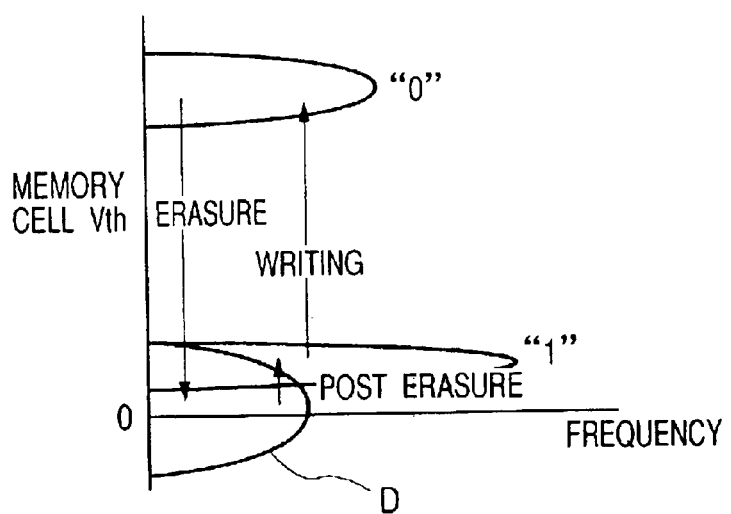
FIG. 5 is a diagram for explaining an example of a distribution of threshold voltages of a memory cell after writing operation and after erasing operation in the flash memory.

FIGS. 4A and 4B show the structure of a memory cell in the flash memory of the embodiment and an example of a bias state at the time of writing and a bias state at the time of erasing. FIG. 5 shows a distribution of threshold voltages of the memory cell after the writing operation and that after the erasing operation. Although not particularly limited, in the flash memory of the embodiment, the data "0" corresponds to a state where the threshold voltage of the memory cell is high, and the data "1" corresponds to a state where the threshold voltage of the memory cell is low.

Figure 4C:
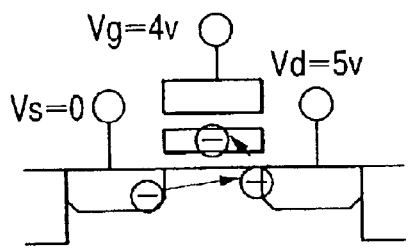

In the embodiment, as shown in FIGS. 4A to 4C, a memory cell used in the flash memory of the embodiment is a MOSFET of the two-layered gate structure having the control gate CG and the floating gate FG. The embodiment employs the following method. At the time of writing data, to a memory cell of a bit corresponding to the write data "0", a positive high voltage such as 10V is applied to the control gate CG as shown in FIG. 4A, 0V is applied to the source, and a voltage such as 5V is applied to the drain, so that a drain current flows. Generated hot electrons are injected to the floating gate FG, thereby increasing the threshold voltage. It is also possible to apply a negative voltage also to the well to increase the writing speed.

At the time of erasing data, as shown in FIG. 4B, the source and drain area made open (that is, the potential is floating). In such a state, a negative high voltage such as −11V is applied to the control gate CG and a positive high voltage such as 10V is applied to the well (substrate) to pull out charges of the floating gate FG by the FN tunneling phenomenon. In such a manner, data is erased on a block unit basis. Alternately, it is also possible to decrease the potential of the well to accordingly increase the negative voltage on the control gate CG, thereby erasing data on the word line unit basis.

Further, in the embodiment, when the threshold of the memory cell is decreased from the high state to the low state by in the erasing operation, a voltage as shown in FIG. 4B is applied to all the memory cells in the whole block sharing the well to pull out the charges. Consequently, there is a case such that the low threshold voltage of a memory cell decreases excessively as shown by a reference character D in FIG. 5. When the threshold voltage of the memory cell decreases to 0V or lower, even in a state where the word line is at a non-selection level (0V), a drain current flows in the memory cell, and an operation of accurately reading the selected memory cells sharing the local drain line LDL cannot be performed.

In the embodiment, therefore, a post-erasure operation of slightly increasing the threshold voltage of the memory cell which has decreased excessively is performed. FIG. 4C shows a bias state of a memory cell on which the post-erasure is performed. Although the post-erasure is a kind of writing operation, the threshold voltage is not intended to be largely changed. In the post-erasure, therefore, a positive high voltage lower than 10V, such as 4V is applied to the control gate CG, 0V is applied to the source, and a voltage such as 5V which is the same at the time of writing operation is applied to the drain, thereby passing a drain current. Hot electrons generated are injected to the floating gate FG to thereby slightly increase the threshold voltage.

Figure 6:
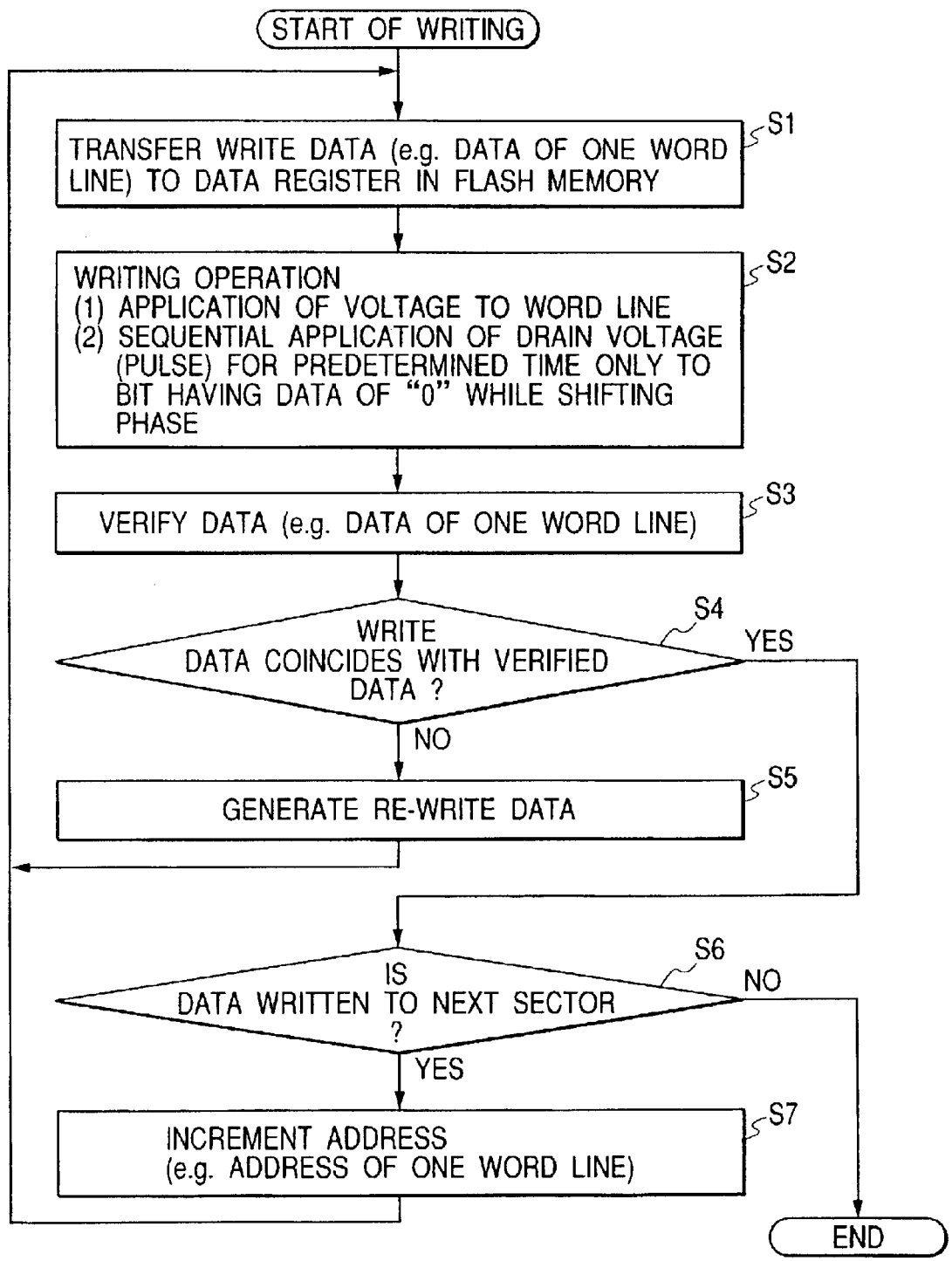
FIG. 6 is a flowchart showing an example of a writing procedure in the flash memory according to the invention.

The writing procedure in the flash memory of the embodiment will now be described with reference to FIG. 6.

When the writing operation is started, first, write data of one word line is transferred to the data register 12 and held (step S1). After the word line WL is raised to the selection level (10V), when the write data held in the data register 12 is "1", a corresponding bit line is skipped and the drain voltage (5V) is applied only to the bit lines corresponding to the data "0" so as to be shifted (step S2). After completion of writing of the write data of one word line, the word line WL is set to the read level for verification, and the data of one word line is read (step S3). The read data is compared with the write data, thereby verifying whether the read data coincides with the write data or not (step S4).

When data disparity is determined by the verifying operation, re-write data is generated in step S5, the program returns to step S1, and the process is repeated until the read data coincides with the write data. The rewrite data here denotes data in which only an unwritten bit "0" in write data of the first sector, that is, a bit of which read data for verification is not changed to "0" is set as "0". Concretely, for example, when write data is "00001111" and read data for verification is "01101111" (data of the sense amplifier is "10010000"), rewrite data is "01101111".

Although such rewrite data is generated by the CPU by using software in the flash memory integrated microcomputer of the embodiment, it can be also generated from the read data for verification by using hardware. Although the write data shown as the concrete example is of eight bits, this is virtual write data provided for easier understanding. The write data held in the data register 12 in the embodiment is data having the number of bits corresponding to the number of memory cells of one word line such as 128 bytes (1024 bits).

When it is verified in step S4 that the read data coincides with the write data, the program shifts to step S6 and whether there is data to be written to the next sector or not is determined. If YES, the address is incremented (+1) in step S7. After that, the program returns to step S1 where the process is repeated. When all data is written, the writing operation is finished.

Figure 7:
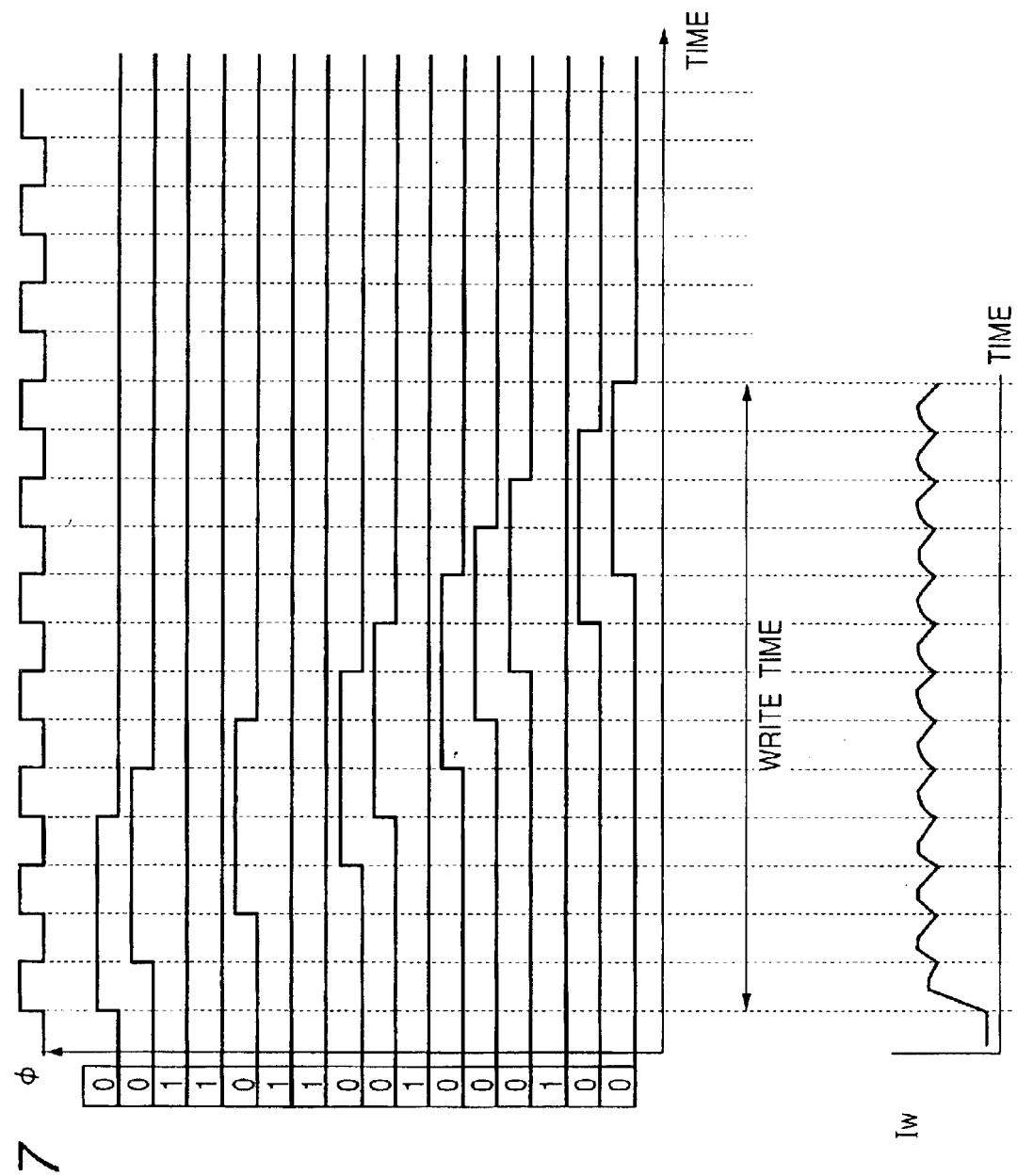
FIG. 7 is a timing chart showing an example of timings of applying a write pulse to each bit line at the time of writing operation in the flash memory of the embodiment and a current waveform chart showing a write current characteristic.

The detailed writing operation in step S2 in the flash memory of the embodiment will now be described by using the timing chart of FIG. 7. In FIG. 7, numerals of "0" and "1" shown on the left side indicate the logic of write data. "0" indicates that the threshold voltage of a corresponding memory cell is increased, and "1" denotes that the threshold is held low. In FIG. 7, the pulse waveform on the right side of each write data represents a voltage waveform (herein below, called a write pulse) applied to the bit line BL. Iw denotes a sum of the write current during the data writing operation.

In the embodiment, as shown in FIG. 7, according to the write data, when the write data is "0", the write pulse is applied and, when the write data is "1", the write pulse is not applied. Write pulses corresponding to the data "0" are sequentially applied to the bit line while being shifted each time by the half cycle of a clock $\phi$. As understood from FIG. 7, in the embodiment, fluctuations in the sum Iw of the write currents are relatively small.

Figure 8A:
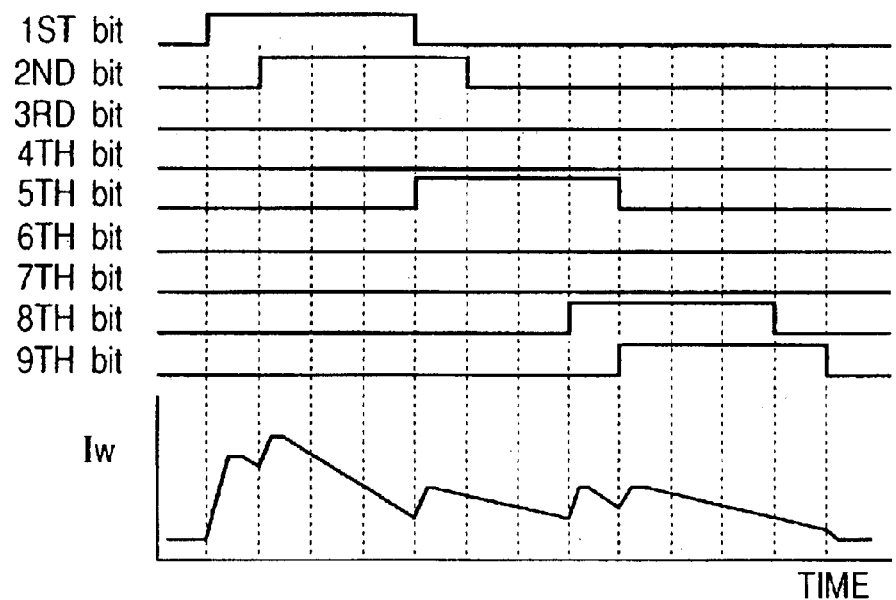
FIG. 8A is a timing chart showing an example of timings of applying a write pulse to each bit line at the time of writing operation in the conventional flash memory and FIG. 8B is a current waveform chart showing a write current characteristic.

For comparison, FIG. 8A shows a timing chart of a conventional write method of shifting the write pulse bit by bit for $1^{st}$ to $9^{th}$ bit values corresponding to those of FIG. 7. As is obvious from FIG. 8A, the conventional method is a method of sequentially selecting bit lines irrespective of write data. Consequently, a clock half cycle is used for each bit line corresponding to data "0" and for each bit line corresponding to data "1". The total write time of the embodiment of the invention is therefore shorter than that of the conventional method by an amount corresponding to the number of bits of the data "1".

Figure 8B:
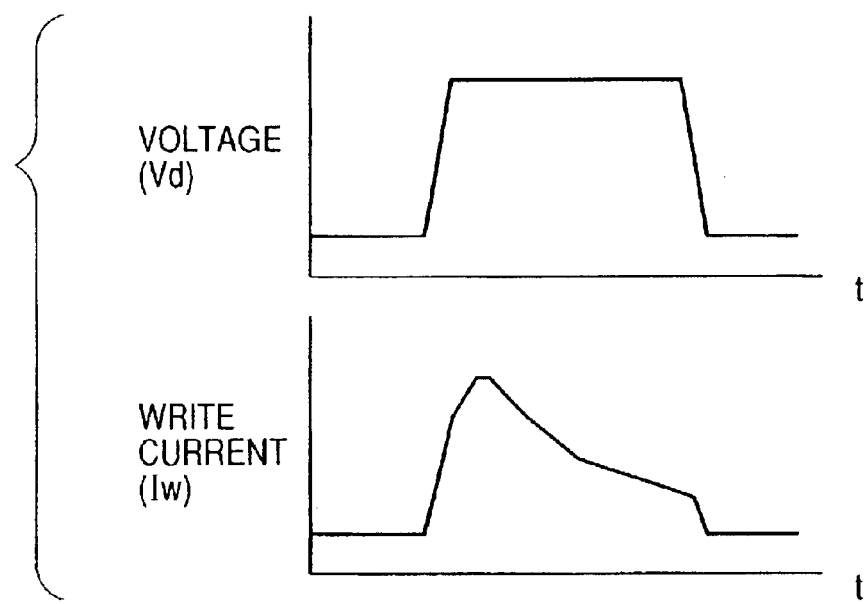

Accordingly, the fluctuations in the sum Iw of the write current in the embodiment of the invention are smaller than those in the conventional method. Specifically, although the drain voltage is maintained constant, the flow of the write current to the memory cell of one bit becomes lower as the threshold voltage increases. A high current therefore flows at the beginning of writing and changes so as to be decreased as shown in FIG. 8B. In the method of applying the write pulses irrespective of whether the data "1" or "0", therefore, the interval of bits to which the write pulse is applied may be wide. It makes the sum Iw of the write current largely fluctuate as shown in FIG. 8A.

Figure 9:
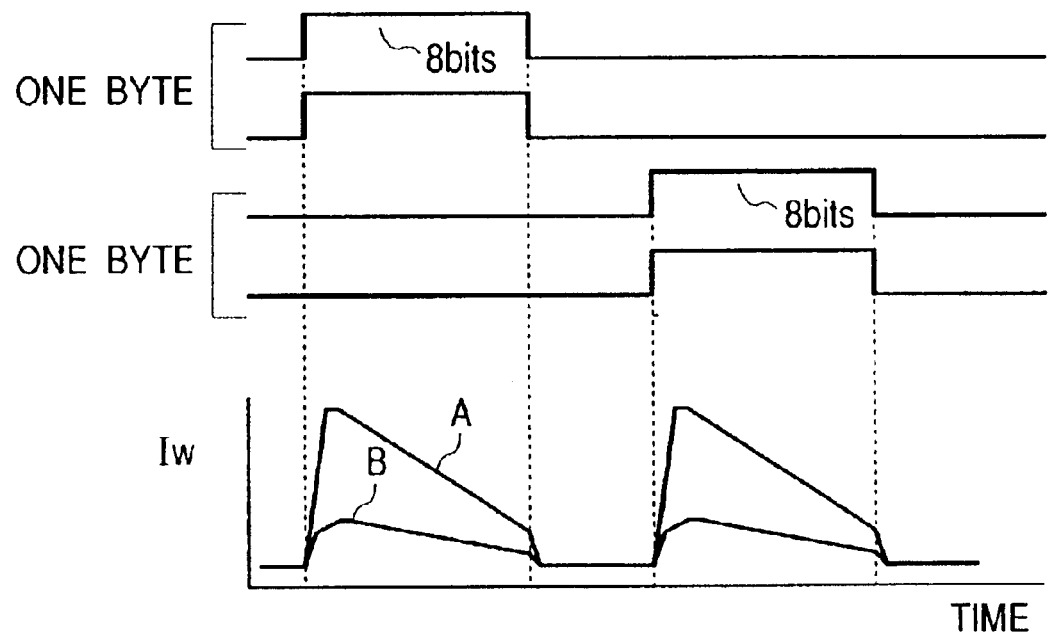
FIG. 9 is a timing chart showing another example of timings of applying a write pulse to each bit line at the time of writing operation in the conventional flash memory and a current waveform chart showing a write current characteristic.

FIG. 9 is a timing chart of the conventional method of sequentially writing data on the byte unit basis without shifting the write pulse. In FIG. 9, a solid line A shows a change in the sum Iw of the write current when the number of bits to which the write pulse is applied is large, and a solid line B indicates a change in the sum Iw of the write current when the number of bits to which the write pulse is applied is small. As is obvious from FIG. 9, since the conventional method is a method of applying a write pulse on the byte unit basis irrespective of the write data, the total write time of the embodiment of the invention is shorter than that of the conventional method by the number of bits of the data "1". The write pulse is applied to the bit line corresponding to the data "0" and no write pulse is applied to the bit line corresponding to the data "1". Consequently, a difference occurs between the write current when the number bits corresponding to the data "0" is large in one byte and the write current when the number of bits corresponding to the data "0" is small in one byte. Moreover, the difference largely varies according to write data.

In the flash memory having therein the booster circuit such as a charge pump for generating the write voltage, when the fluctuation in the write current is large, the write voltage is accordingly vulnerable to fluctuations and it is feared that the writing operation cannot be performed stably. When the write current fluctuates largely, the booster circuit has to be preliminarily designed so as to deal with the fluctuation. By applying the invention, therefore, the fluctuation in the write current can be lessened, thereby enabling the stable writing operation to be performed and facilitating the designing of the booster circuit.

A concrete example of the write control circuit capable of performing the writing operation while skipping bits corresponding to data "1" will now be described by using FIG. 10. The circuit of FIG. 10 corresponds to the data register 12 and the write control circuit 13 in FIG. 2.

Figure 10:
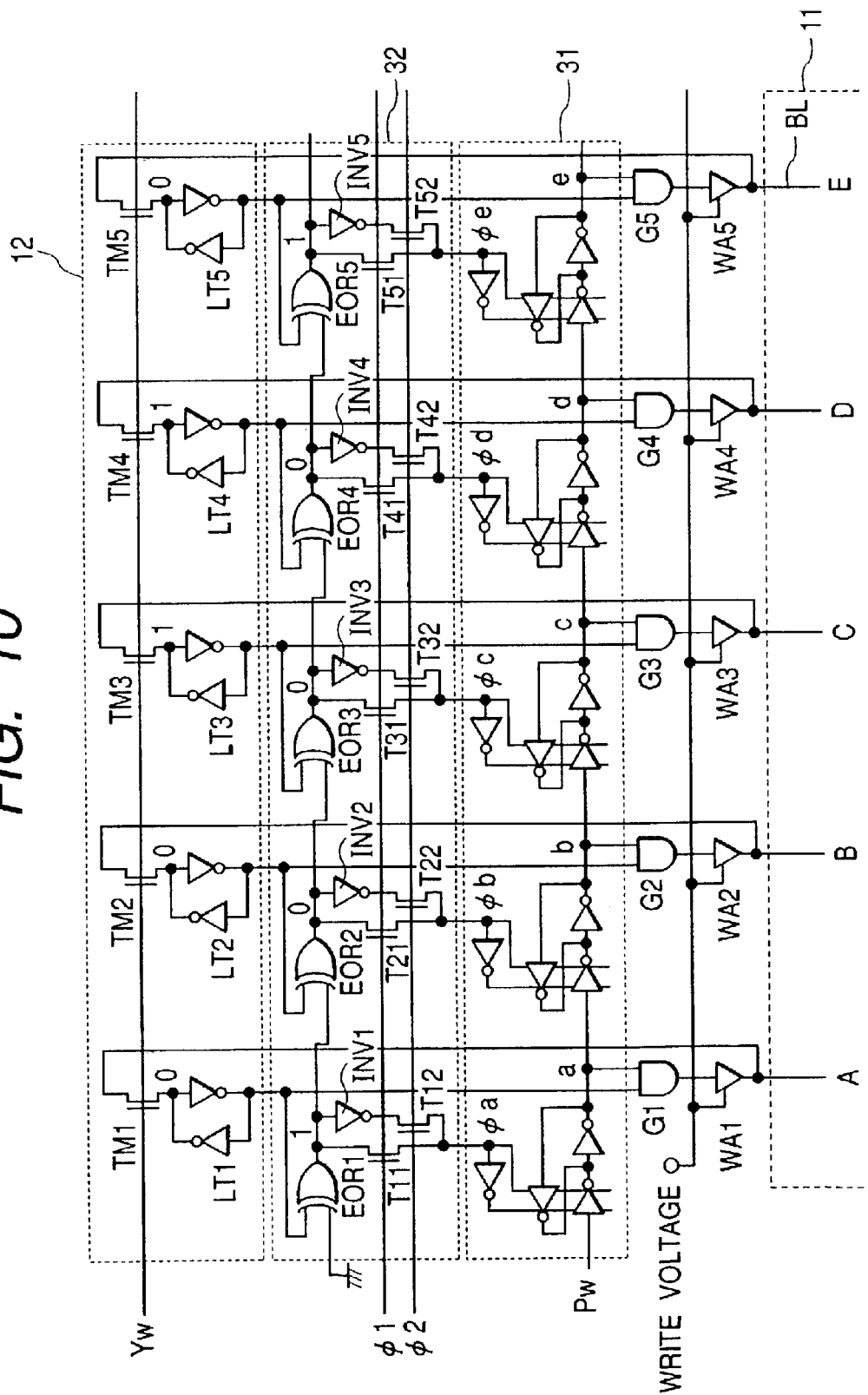
FIG. 10 is a circuit diagram showing a concrete example of a write control circuit in the flash memory of the embodiment.

As shown in FIG. 10, the data register 12 is constructed by transfer MOSFETS TM1, TM2, TM3, . . . for capturing bits of write data once latched by sense amplifiers, and latch circuits LT1, LT2, LT3, . . . each constructed by a pair of inverters whose input/output terminals are coupled to each other. The write control circuit 13 is constructed by: a shift register 31 for controlling writing operation; a data determining and shifting control circuit 32 for determining whether each of bits of the write data latched by the data register 12 is "1" or "0" and controlling a shifting operation at each stage in the shift register 31 in accordance with the determined bit; AND gates G1, G2, G3, . . . for receiving a shifted clock from the data determining and shifting control circuit 32 and data latched by the latch circuits LT1, LT2, LT3, . . . of the data register 12; and write amplifiers WA1, WA2, WA3, . . . for using the write voltage Vpp such as 10V as a source voltage, receiving outputs of the AND gates G1, G2, G3, . . . , and driving the corresponding bit lines BLL.

Reference characters A B, C, D, and E shown in FIG. 10 are connected to the bit lines BL. Yw in FIG. 10 denotes a write data input timing signal.

The data determining and shifting control circuit 32 is constructed by: an exclusive OR gate EORi having an input terminal for receiving data latched by each of the latch circuits LT1, LT2, LT3, . . . of the data register 12 and the other input terminal for receiving an output of the preceding stage; an inverter INVi for inverting an output of the exclusive OR gate EORi; and transfer MOSFETs Ti1 and Ti2 for selectively receiving either an output of the inverter INVi or an output of the exclusive OR gate EORi and supplying the selected output as a shift clock to each of the stages of the shift register 31.

To one of input terminals of an exclusive OR gate EOR1 at the first stage of the exclusive OR gates EORi, in place of an output of an exclusive OR gate EOR(i−1) at the preceding stage, the ground potential is applied. Consequently, an output signal of the exclusive OR gate EOR1 at the first stage is "1" when the data latched in the LT1 in the data register 12 is "0". The output signal is "0" when the data held in the latch circuit LT1 is "1". When data latched in the corresponding latch circuit LTi is "0", each of the exclusive OR gates EORi at the second and subsequent stages inverts an output of the exclusive OR gate EOR(i−1) at its preceding stage and outputs the inverted output. When the data latched in the latch circuit LT1 is "1", the exclusive OR gate EORi outputs the output of the exclusive OR gate EOR(i−1) at its preceding stage as it is.

Figure 11:
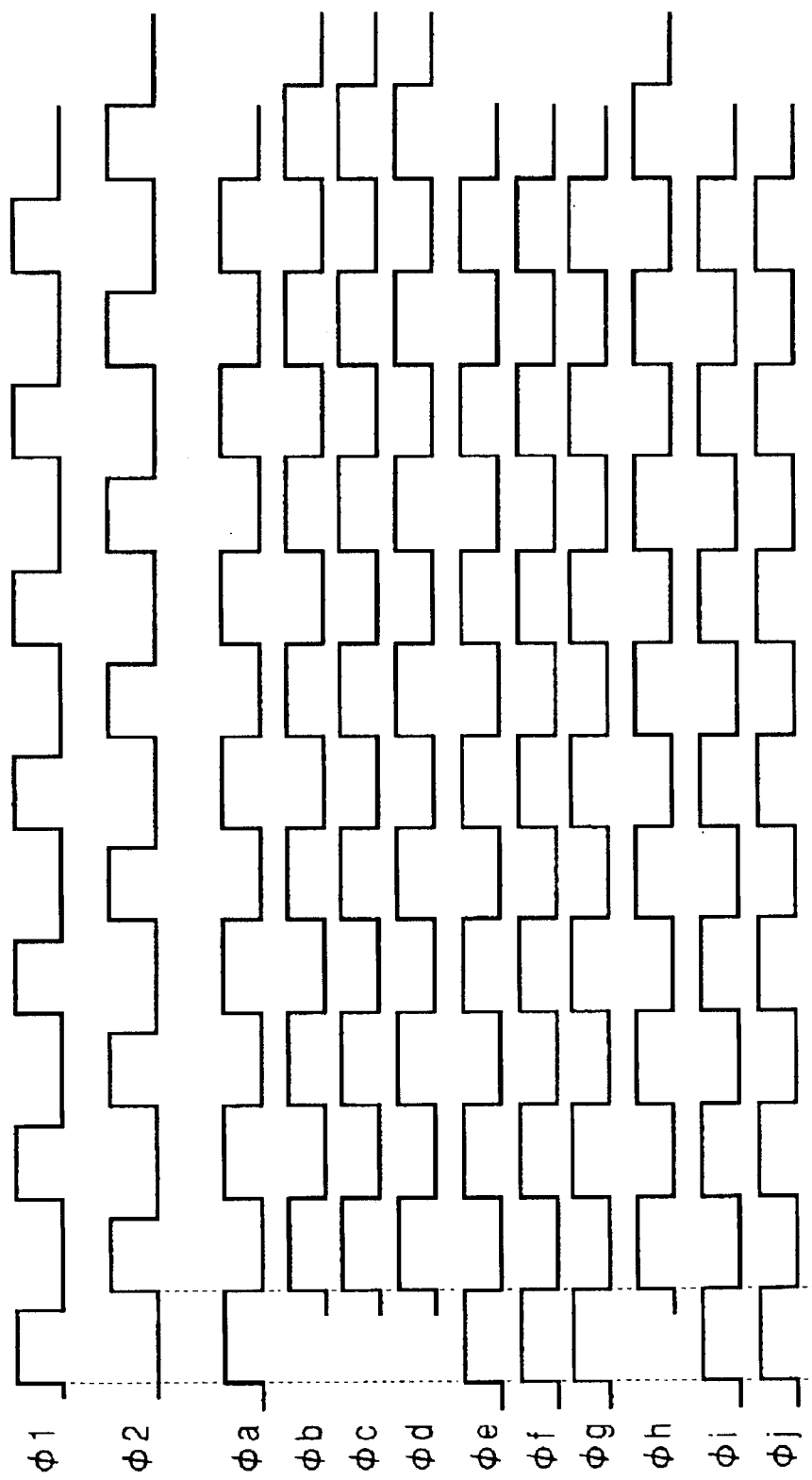
FIG. 11 is a timing chart of signals for giving timings of applying a write pulse to each bit line in the write control circuit of the embodiment.

Clocks $\phi1$ and $\phi2$ for controlling the clock transfer MOSFETs Ti1 and Ti2 in the data determining and shifting control circuit 32 are clocks having phases deviated from each other by 180° so that their high-level periods are not overlapped with each other as shown in FIG. 11. Consequently, when the output of the corresponding exclusive OR gate EORi is at the high level, clocks (for example, $\phi$a and $\phi$e in FIG. 11) which go high synchronously with the rising edge of the clock $\phi1$ and go low synchronously with the rising edge of the clock $\phi2$ are supplied to the stages of the shift register 31 for controlling writing operation. When an output of the corresponding exclusive OR gate EORi is at the low level, clocks (for example, $\phi$b, $\phi$c, and $\phi$d in FIG. 11) which go high synchronously with the rising edge of the clock $\phi2$ and go low synchronously with the rising edge of the clock $\phi1$ are supplied.

Figure 12:
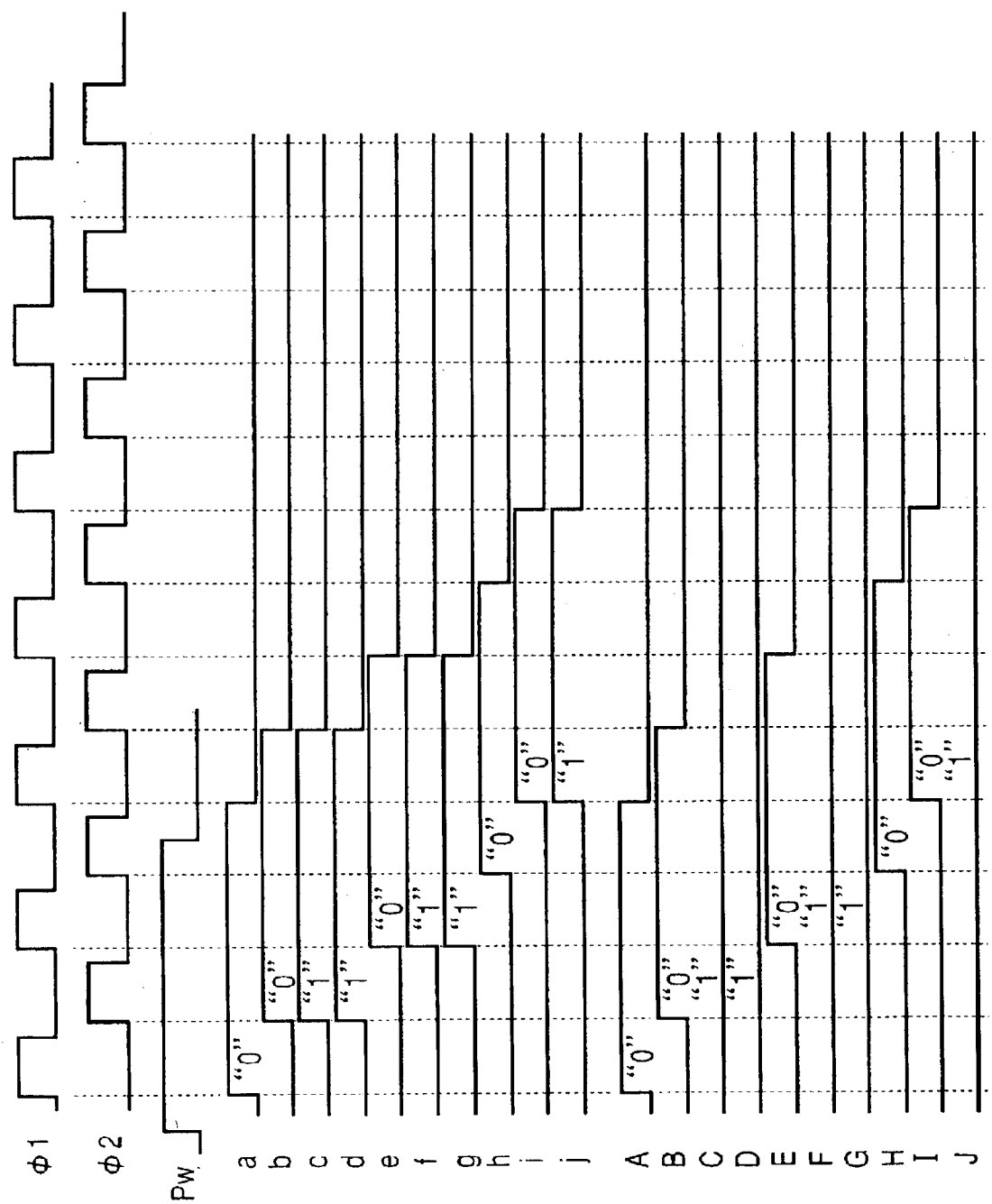
FIG. 12 is a timing chart showing internal signals of the write control circuit of the embodiment and timings of applying a write pulse to each bit line.

At the first stage of the shift register 31 for controlling writing operation, as shown in FIG. 12, for example, a pulse Pw having a cycle almost double as that of the clock $\phi1$ is input. The operation is performed so as to sequentially transmit the write pulse Pw from the preceding stage to the subsequent stage by clocks $\phi$a, $\phi$b, $\phi$c, $\phi$d, $\phi$e . . . ) from the data determining and shifting control circuit 32. In the successive clocks changing at the same timing (for example, $\phi$b, $\phi$c, and $\phi$d), racing occurs among the stages in the shift register 31 for controlling writing operation, and a pulse applied to the first stage is latched by all the subsequent stages. Waveforms of reference characters (a) to (j) in FIG. 12 denote outputs of the stages of the write control shift register 31, and waveforms of reference characters (A) to (J) denote write pulses applied to bit lines.

As shown by the waveforms indicated by the reference characters (a) to (j) in FIG. 12, for the bit "0" in the write data, the transmission write pulse is delayed only by a half cycle of the clock $\phi1$ ($\phi2$). For the bit "1" in the write data, the transmission write pulse is transmitted without a delay. As a result, as shown by the waveforms indicated by the reference characters A to J in FIG. 12, the write pulses applied to the bit line become pulses sequentially deviated only by the half cycle of the clock $\phi1$ ($\phi2$) and coincide with the waveforms shown in FIG. 7.

Figure 13:
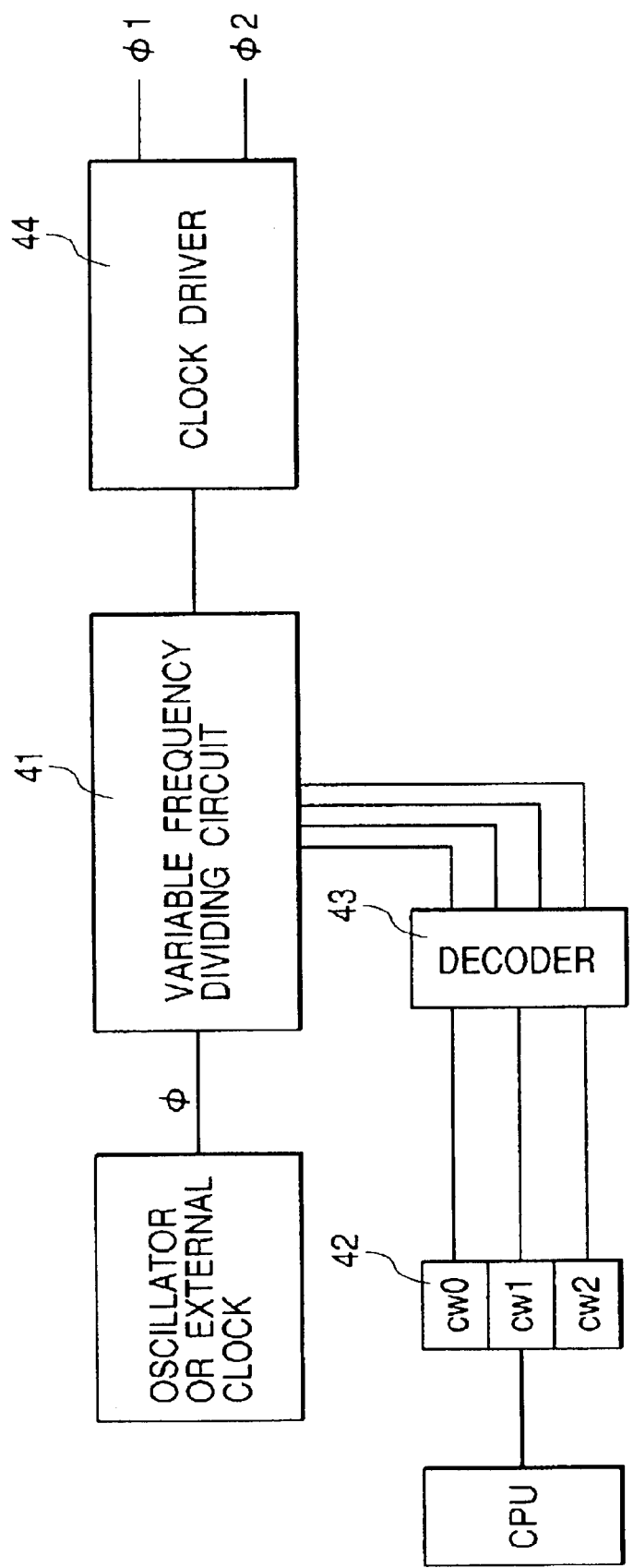
FIG. 13 is a block diagram showing an example of a circuit for generating a clock for controlling a data determining and shifting control circuit of the embodiment.

FIG. 13 shows an example of a circuit for generating the clocks $\phi1$ and $\phi2$ for controlling the data determining and shifting control circuit 32. The clock generating circuit is provided for the flash memory FLLASH or flash memory controller FLC in FIG. 1. As shown in FIG. 13, the clock generating circuit of the embodiment includes: a variable frequency dividing circuit 41 for dividing the frequency of a reference clock $\phi$ supplied from an internal oscillator OCS or from the outside; a register 42 for setting a frequency dividing ratio in the variable frequency dividing circuit 41 by the CPU; a decoder 43 for decoding set values cw0, cw1, and cw2 of the register 42 and generating a control signal for changing the frequency dividing ratio to the variable frequency dividing circuit 41; and a clock driver 44 for generating the clocks $\phi1$ and $\phi2$ whose high level periods are not overlapped with each other and having the same cycle on the basis of the clock obtained by the frequency dividing operation of the variable frequency dividing circuit 41. A value to be set in the register 42 to set a value for designating the frequency dividing ratio in the variable frequency dividing circuit 41 can be stored in a predetermined memory cell in the nonvolatile memory.

Figure 14:
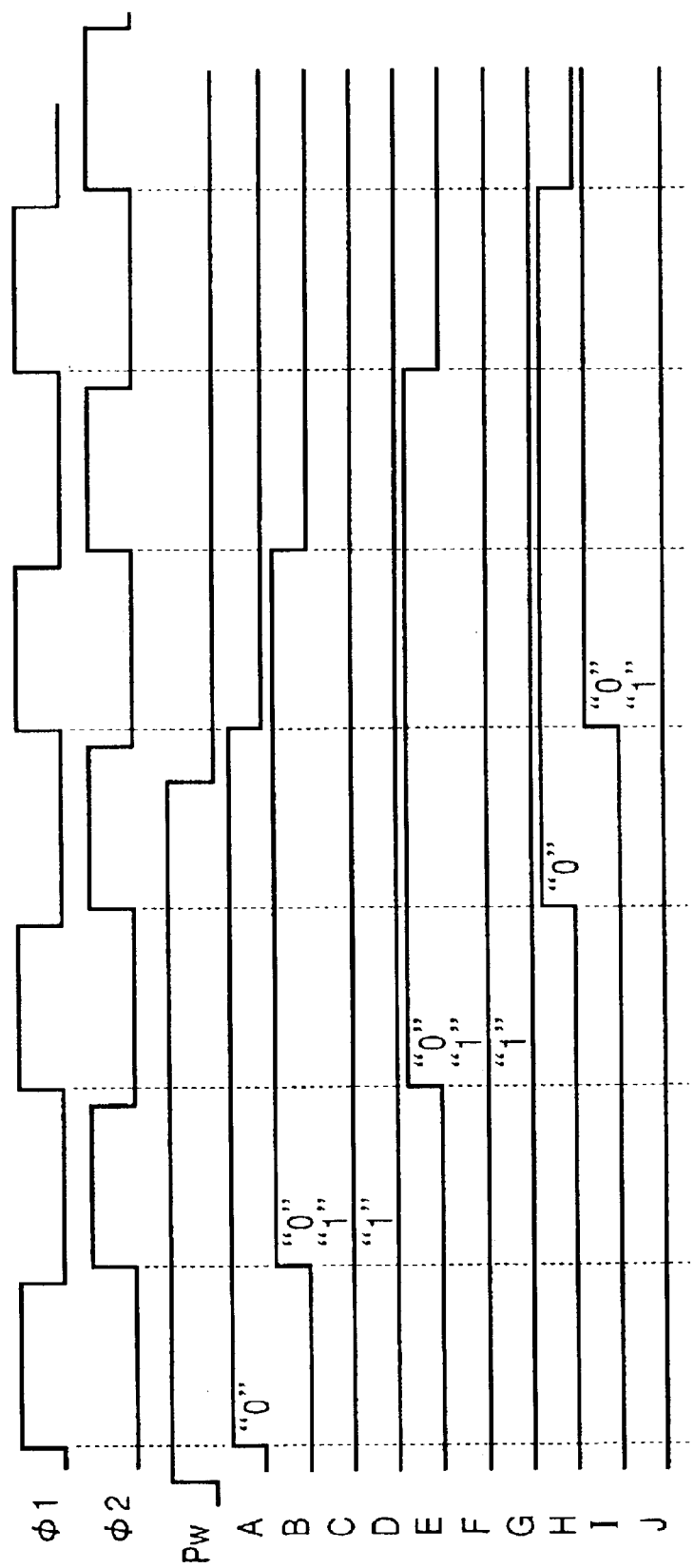
FIG. 14 is a timing chart showing a waveform of the write pulse when the cycle of the clock is doubled in the case where a write pulse is generated at the timings shown in FIG. 12.

By providing the variable frequency dividing circuit 41 to change the cycle of each of the clocks $\phi1$ and $\phi2$ to be generated and to supply the resultant to a write pulse generating circuit (refer to FIG. 15) which will be described herein later, the pulse width of the write pulse Pw as a reference to be generated by the write pulse generating circuit can be changed. FIG. 14 shows waveforms of the clocks $\phi1$ and $\phi2$ whose cycles are doubled in the case of generating write pulses at timings shown in FIG. 12. As obviously understood by the comparison between FIGS. 12 and 14, in FIG. 14, the cycle of each of the clocks $\phi1$ and $\phi2$ is twice as long as that in FIG. 12, and the write pulse Pw is also twice as long as that in FIG. 12.

Although optimum write time of memory cells constructing the flash memory may vary due to variations in manufacture, by changing the width of the write pulse, a writing process can be performed for a time according to the characteristics of the memory cells. In the flash memory, the threshold voltages of all the memory cells cannot be changed to a desired level by a single writing process due to variations in the memory cells and there is a case that the writing operation is performed again. In this case, however, the threshold voltage has already changed. It is therefore desirable to perform the writing operation of the second time by using a write pulse of a longer cycle than that of the writing operation of the first time. Consequently, by changing the width of the write pulse Pw as described above, the writing operation can be optimally performed a plurality of times because the write characteristics of the memory cell are that a change amount of the threshold voltage is linear with respect to logarithm time.

write pulses A and B are overlapped in the cycle T2, two write pulses B and E are overlapped in the cycle T3, two write pulses E and H are overlapped in the cycle T4, and two write pulses H and I are overlapped in the cycle T5.

Other than the above, by changing the set values cw0 to cw2 in the register 42 and the set values pw0 to pw2 in the register 52 and, for example, setting the number of over lap bits to "6", six write pulses are overlapped. By setting the cycle of each of the clocks $\phi1$ and $\phi2$ to twice, four times, eight times or the like, the width of the write pulse can be changed. Table 1 shows the relation between the set values cw0 to cw2 in the register 42 and the frequencies of the clocks $\phi1$ and $\phi2$, the relation between the set values pw0 to pw2 in the register 52 and the number of write overlap bits, and the relation between the set values pw0 to pw2 in the register 52 and the write pulse width.

TABLE 1

| write clock frequency | | the number of overlap write bits (pw2, pw1, pw0) | | | | | width of write pulse (pw2, pw1, pw0) | | | | |
|---|---|---|---|---|---|---|---|---|---|---|---|
| (cw2, cw1, cw0) | $\Phi1, \Phi2$ | (0, 0, 0) | (0, 0, 1) | (0, 1, 0) | (0, 1, 1) | ... | (0, 0, 0) | (0, 0, 1) | (0, 1, 0) | (0, 1, 1,) | ... |
| (0, 0, 0) | 4 MHz | 2 | 4 | 6 | 8 | ... | 0.25 us | 0.5 us | 0.75 us | 1 us | . |
| (0, 0, 1) | 2 MHz | | | | | | 0.5 us | 1 us | 1.5 us | 2 us | . |
| (0, 1, 0) | 1 MHz | | | | | | 1 us | 2 us | 3 us | 4 us | . |
| (0, 1, 1) | 0.5 MHz | | | | | | 2 us | 4 us | 6 us | 8 us | . |
| . | . | | | | | | . | . | . | . | |
| . | . | | | | | | . | . | . | . | |

Figure 15:
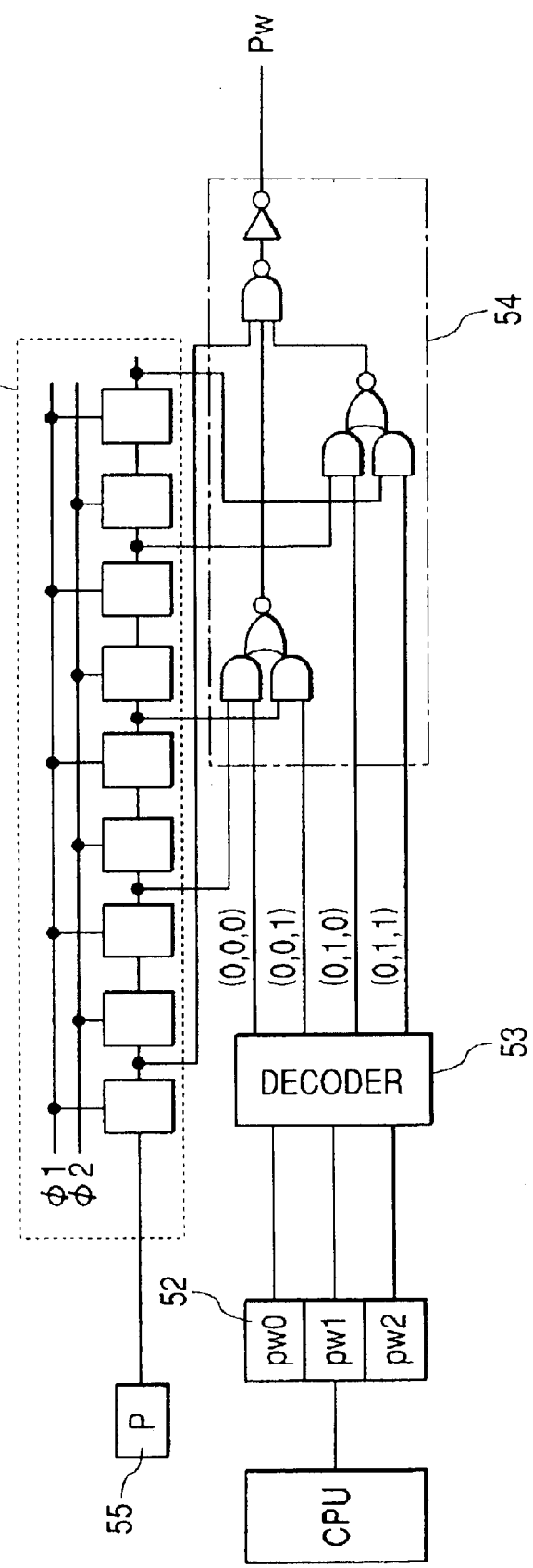
FIG. 15 is a block diagram showing an example of the configuration of a variable frequency divider and a circuit portion for generating the write pulse as a reference.

The write pulse generating circuit shown in FIG. 15 includes: a shift register 51 for performing a shifting operation synchronously with the clocks $\phi1$ and $\phi2$; a register 52 for setting the number of bits to be overlapped in the write pulse generating circuit by the CPU; a decoder 53 for decoding set values pw0, pw1, and pw2 of the register 52; and a pulse adjusting circuit 54 constructed by AND gates and NOR gates each for receiving a signal supplied from a predetermined stage in the shift register 51 and an output signal of the decoder 53. A value set in the register 52 for setting a value which designates the number of bit lines to which the write voltage is applied in parallel can be stored in a predetermined memory cell in the nonvolatile memory.

In FIG. 15, reference numeral 55 denotes a flag provided for a control register or the like. When "1" is set in the write flag 55 by the CPU, the shift register 51 is allowed to operate validly. Concretely, write data of one word line (for example, 128 bytes) is transferred to the data register 12 and, after that, the CPU sets "1" in the write flag 55, thereby activating the write pulse generating circuit to start generation of a write pulse. The write pulse generating circuit is provided for the flash memory FLASH or flash memory controller FLC in FIG. 1.

Figure 16:
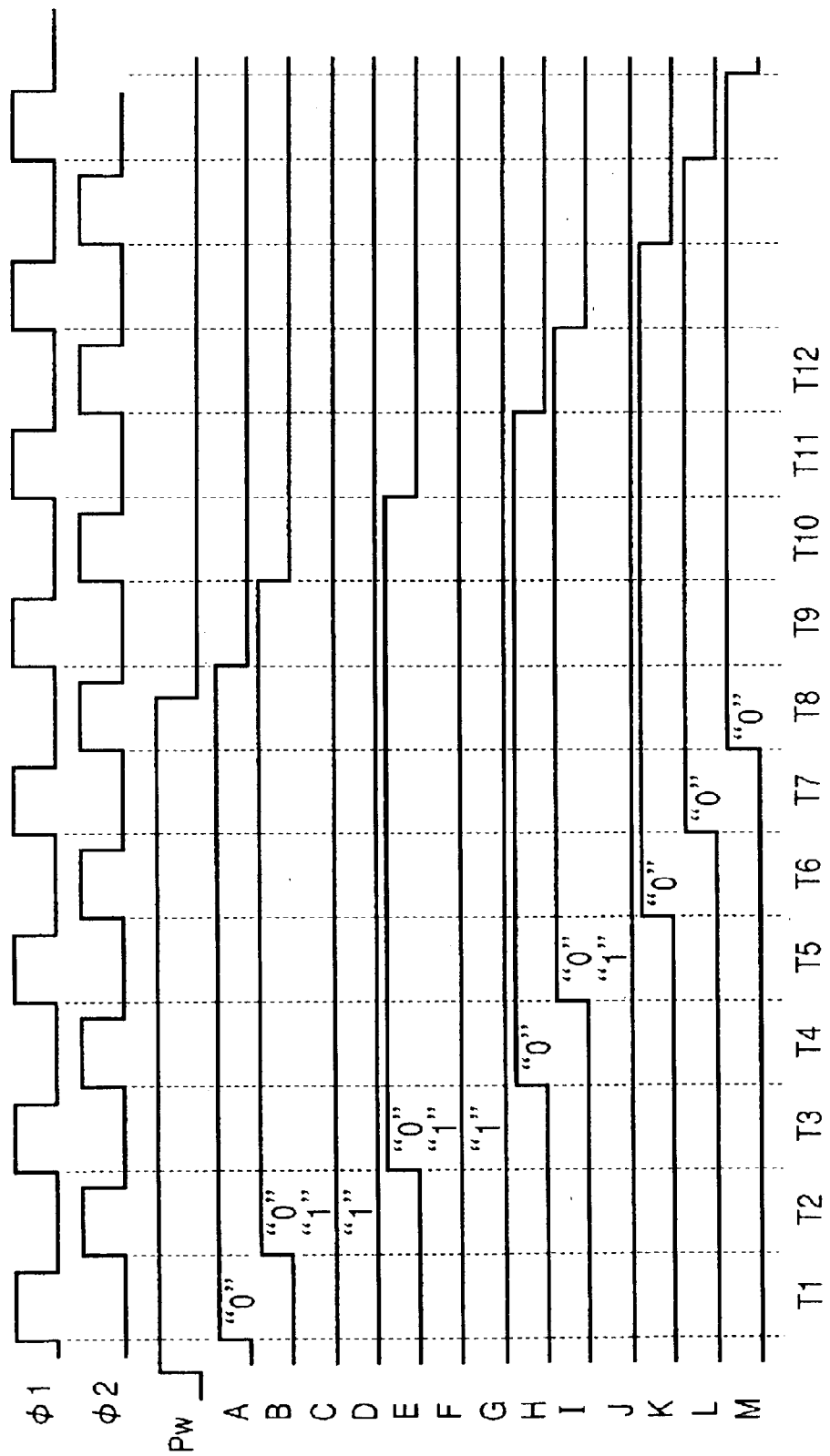
FIG. 16 is a timing chart showing an example of other timings of the write pulse applied to each bit line.
Figure 17:
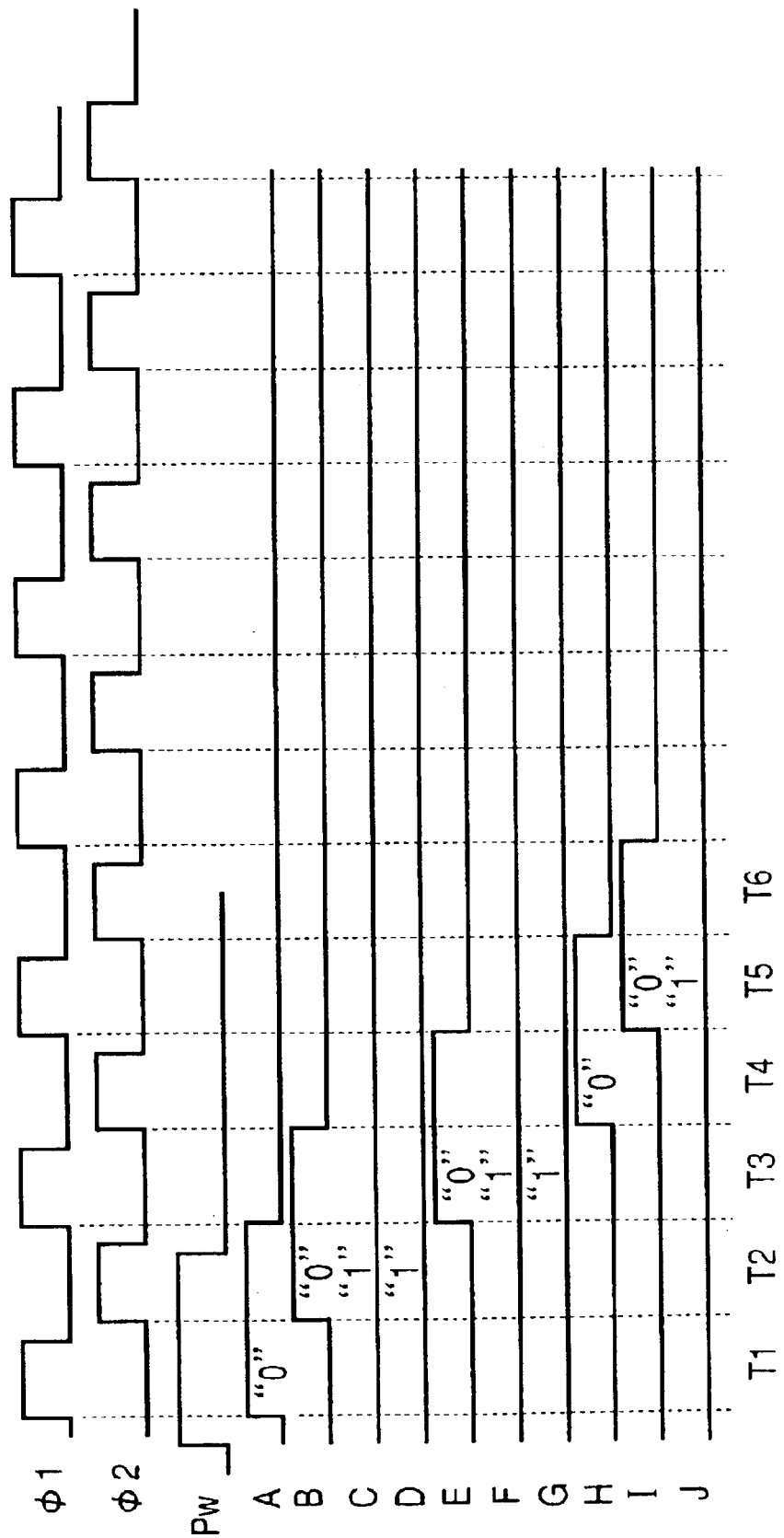
FIG. 17 is a timing chart showing an example of other timings of the write pulse applied to each bit line.
Figure 18:
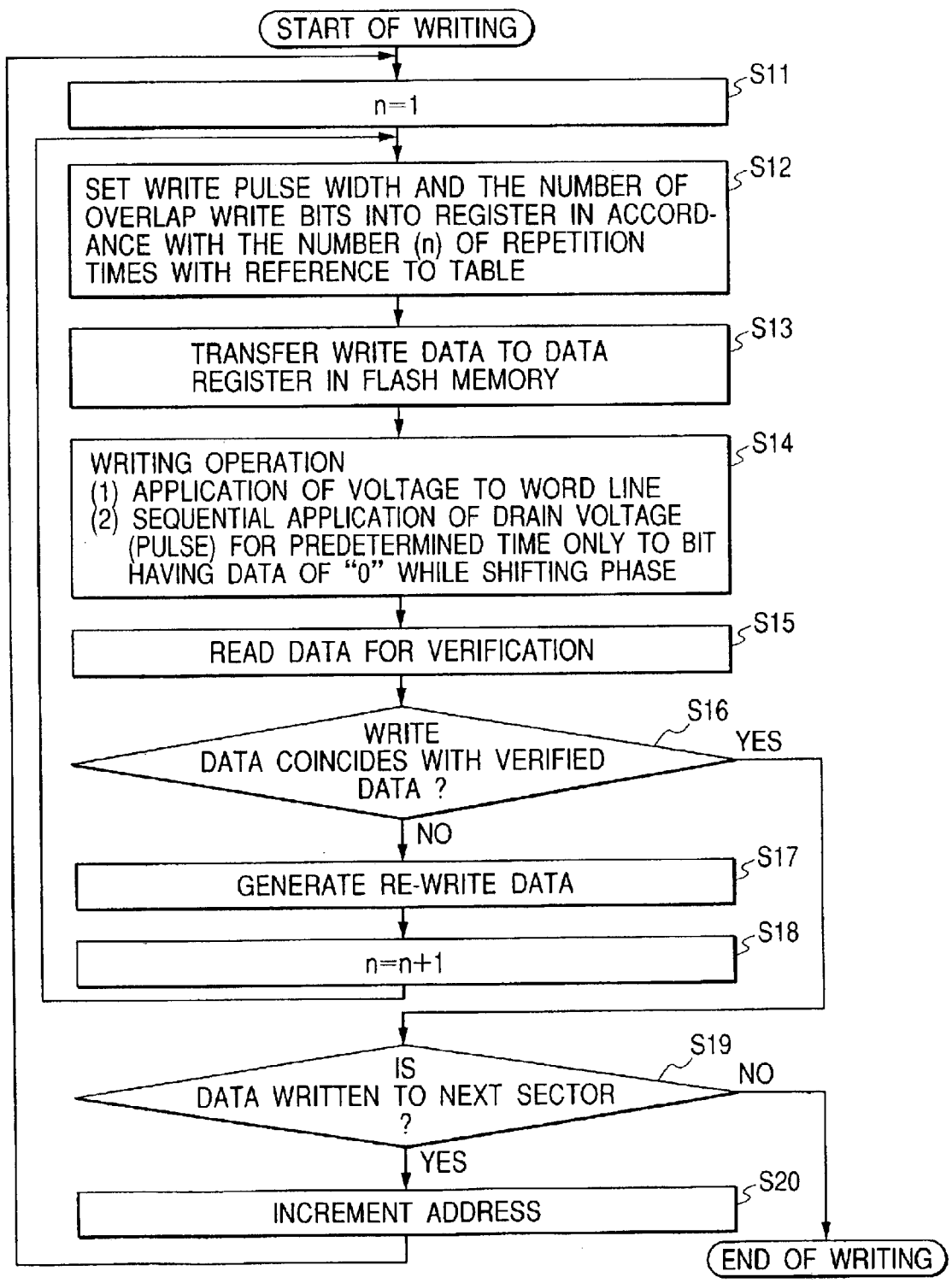
FIG. 18 is a flowchart showing a more concrete example of a writing procedure in the flash memory according to the invention.

FIGS. 16 and 17 show waveforms in the case where the numbers of write overlap bits illustrated in FIG. 12 are "8" and "2", respectively, with the cycles of the clocks $\phi1$ and $\phi2$ which are the same as those in the case where the number of write overlap bits is "4" illustrated in FIG. 12. As obviously understood from the comparison of the waveforms between FIG. 12 and FIGS. 16 and 17, in FIG. 12, four write pulses A, B, E, and H are overlapped with each other in the cycle T4. In contrast, in FIG. 16, eight write pulses A, B, E, H, I, K, L, and M are overlapped in a cycle T8. In FIG. 17, two The set values cw0 to cw2 in the register 42 and the set values pw0 to pw2 in the register 52 may be initially set to optimum values in accordance with the characteristics of memory cells which have been preliminarily measured and obtained at the start of the system or the like, or may be dynamically changed at the time of rewriting as described above. An example of such a control will now be described by referring to the flowchart of FIG. 18.

In the write control of the embodiment, when the writing operation is started, first, the count value (n) of a counter for counting the number of repeating times of application of the write pulse is set to "1" (step S11) In step S12, with reference to the number (n) of the repeating number counter, the set values pw0, pw1, and pw2 of the register 52 for setting the number of overlap bits are determined and set in accordance with the value (n). Concretely, the smaller the value (n) is, the more the number of overlap bits is reduced.

Write data of a word line is transferred to the data register 12 and held in the data register 12 (step S13) After the word line WL is raised to a selection level (10V) according to the write data held in the data register 12, when the write data is "1", a corresponding bit line is skipped and a drain voltage (5V) is applied only to bit lines corresponding to the data "0" so as to be shifted (step S14). At this time, the pulse adjusting circuit 54 in FIG. 15 adjusts the width of a write pulse as a reference in accordance with the set values pw0, pw1, and pw2 in the register 52 for setting the number of overlap bits set in step S12. The write control circuit 13 in FIG. 10 which has received the resultant generates the write pulses which are partially overlapped in accordance with the number of overlap bits set.

After completion of writing of data of one word line as described above, the word line WL is set to the read level for verification and data of one word line is read (step S15). The read data is compared with the write data and determined (verified) whether they coincide with each other or not (step S16).

When disparity of the data is determined by the verification, rewrite data is generated in step S17, the repetition number (n) is incremented (+1) in step S18, and the program returns to step S12. The process is repeated until the read data coincides with the write data.

When coincidence of the data is determined by the verification in step S16, the program advances to step S19 and whether data is written to the next sector or not, that is, whether the operation of writing data to all the sectors has finished or not is determined. If NO, the address is incremented (+1) in the following step S20. After that, the program returns to step S11, and the process is repeated. When the operation of writing data to all the sectors is finished, the writing operation is finished.

The control of generating the write pulse by using the register 52 for setting the number of overlap bits has been described above. Similarly, the width of the write pulse Pw as a reference generated by the write pulse generating circuit may be changed by setting the set values cw0, cw1, and cw2 of the register 42 for setting the frequency dividing ratio in FIG. 13 in accordance with the repetition number of applying the write pulse, changing the frequency dividing ratio in the variable frequency dividing circuit 41, generating the clocks $\phi1$ and $\phi2$ having the same cycle, whose high-level periods are not overlapped with each other on the basis of the clock obtained by the frequency division of the variable frequency dividing circuit 42, and supplying the clocks $\phi1$ and $\phi2$ to the write pulse generating circuit in FIG. 15.

Figure 19:
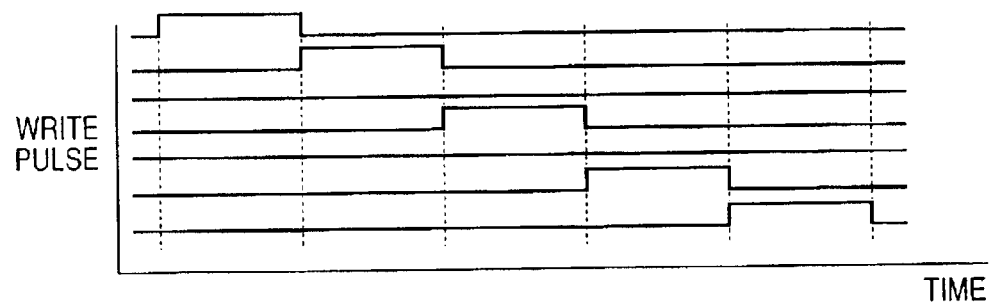
FIG. 19 is a timing chart showing an example of other timings of the write pulse to be applied to each bit line.

The embodiment of successively writing only the bit "0" while skipping the bit "1" in accordance with write data and overlapping the plurality of bit write pulses, thereby shortening the write time as a total has been described above. According to the invention, for example, also by a simple skip method of skipping the bit corresponding to write data "1" and successively writing the bit corresponding to write data "0" without overlapping the write pulses as shown in FIG. 19, an effect such that the write time can be shortened and a fluctuation amount of the write current can be reduced as compared with the conventional method which does not skip the write bit can be produced.

Figure 20A:
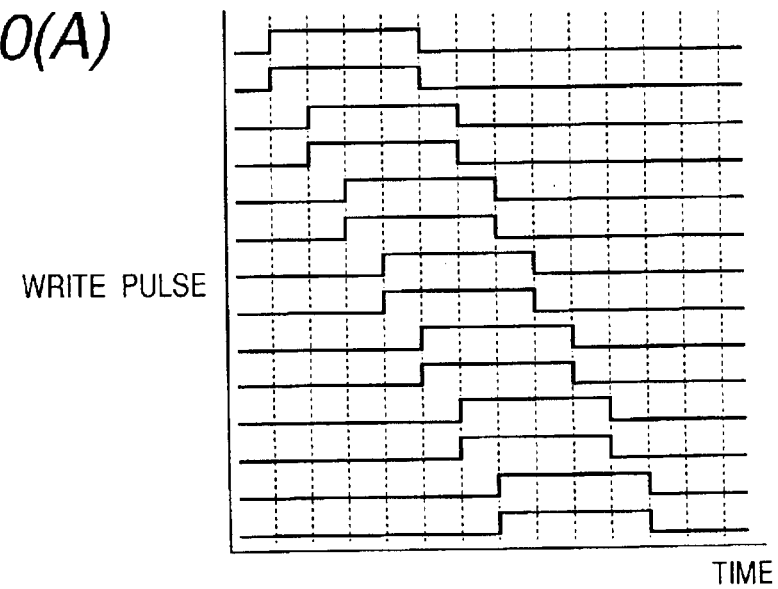
FIGS. 20A and 20B are timing charts showing other examples of the timings of the write pulse to be applied to each bit line.
Figure 20B:
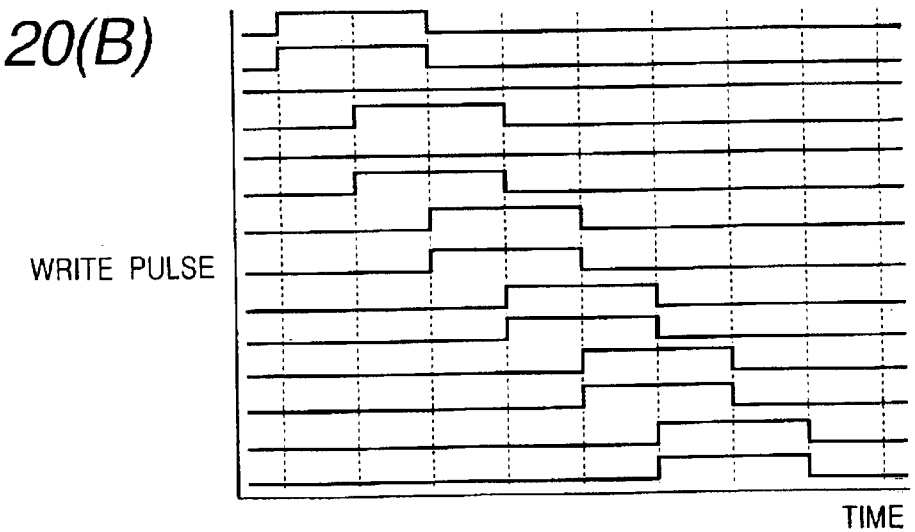

Also in the case of overlapping the write pulses, the invention is not limited to the method of shifting the write pulses every half cycle of the clock bit by bit as in the foregoing embodiment, but a method of overlapping the write pulses of a plurality of bits at timings as shown in FIG. 20A, or a method of overlapping the write pulses of a plurality of bits and generating the write pulses so as to be shifted every half cycle of the clock may be also employed. In this case as well, while skipping bits corresponding to the write data "1", only bits corresponding to the write data "0" are successively written.

Figure 21:
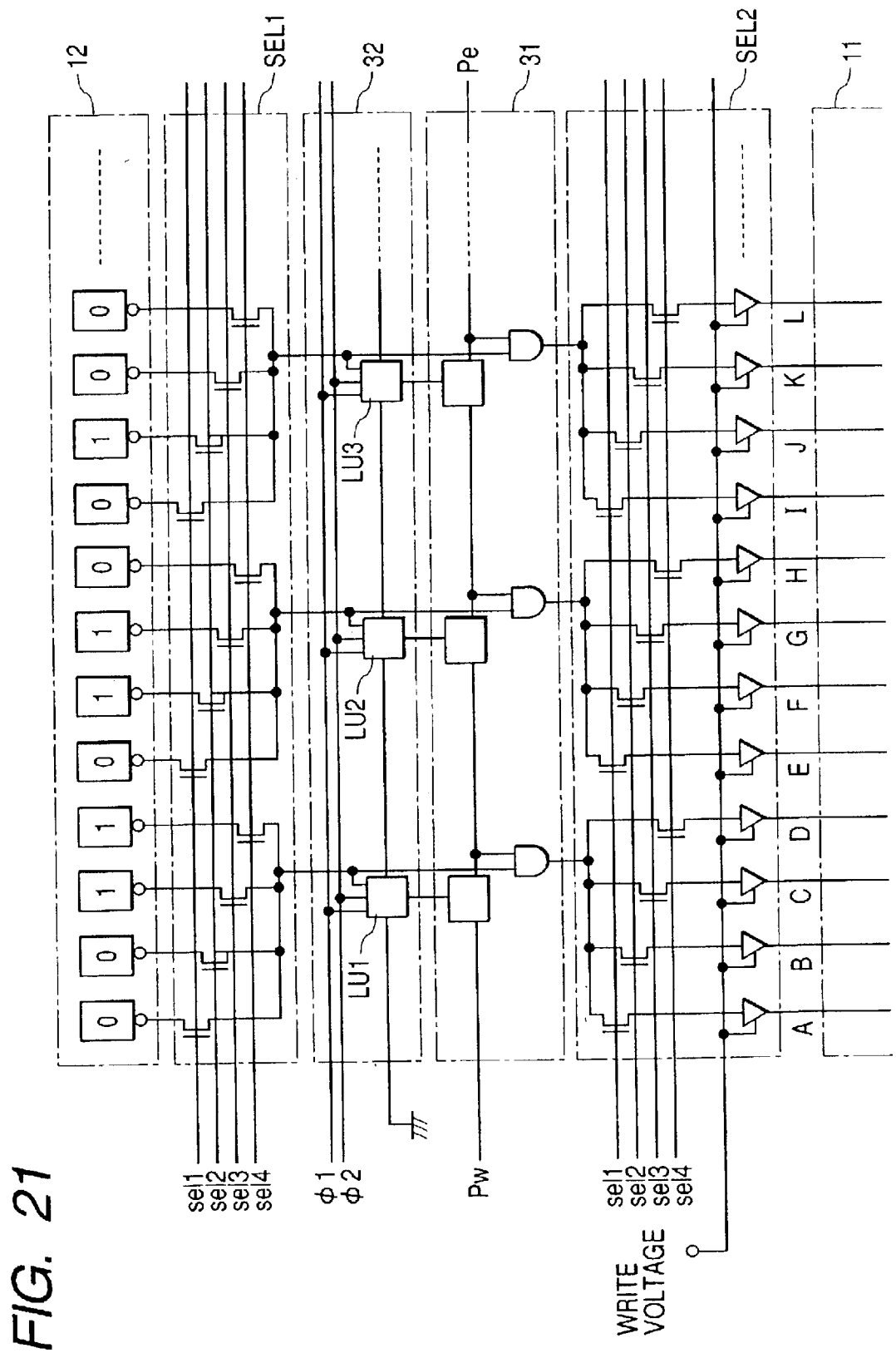
FIG. 21 is a circuit diagram showing another concrete example of the write control circuit in the flash memory of the embodiment.

FIG. 21 shows another embodiment of the write control circuit 13 in FIG. 2. The write control circuit in the embodiment is basically similar to the circuit of the embodiment shown in FIG. 10. In the circuit of FIG. 10, the number of stages of the shift register 31 is determined in correspondence with the number of bit lines of the memory array, and the data determining and shifting control circuit 32 is constructed by arranging logic circuit units LUi each having the exclusive OR gate EORi, inverter INVi, and transfer MOSFETs TM1$i$ and TM2$i$ in correspondence with the stages of the shift register 31. Consequently, the circuit scale is very large.

In the embodiment, as shown in FIG. 21, one logic circuit unit LUi and each of the stages of the shift register in the circuit of FIG. 10 are provided for every four bit lines, a first selection circuit (multiplexer) SEL1 is provided between the data determining and shifting control circuit 32 and the data register 12, and a second selection circuit (demultiplexer) SEL2 is provided between the shift register 31 and a column of write amplifiers WA1, WA2, WA3, . . . , to share the logic circuit units by the plurality of bits, thereby reducing the circuit scale. In the case where the logic circuit unit is provided for each bit line, when the bit lines are densely provided, it is very difficult to lay out the logic circuit unit in accordance with the bit lines. By sharing the logic circuit unit by the plurality of bit lines, the number of logic circuit units can be decreased and the layout of the logic circuit unit is facilitated. Each of the selection circuits SEL1 and SEL2 is constructed by a set of four transfer MOSFETs. The four transfer MOSFETs constructing a set are turned on/off by selection control signals se10, se11, se12, and se13.

Figure 22:
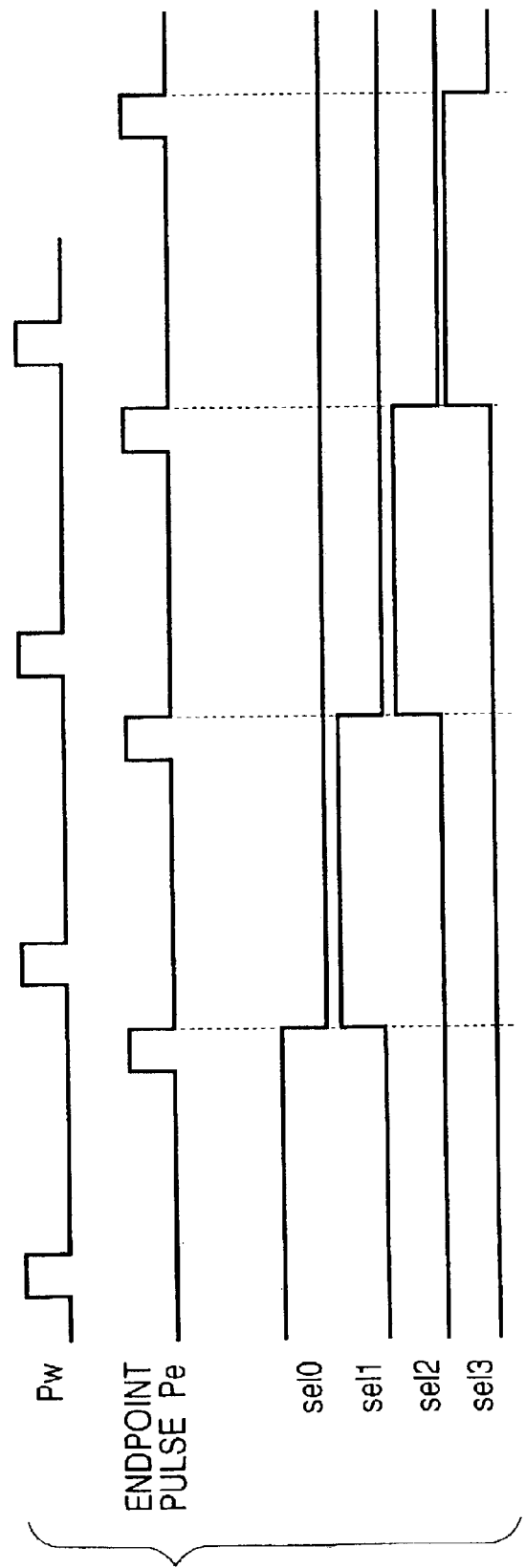
FIG. 22 is a timing chart showing timings of internal signals of the write control circuit of FIG. 21.

In the embodiment, as shown in FIG. 22, only one of the selection control signals se10, se11, se12, and se13 is set to the high level in rotation, and the write pulse Pw is shifted from the first stage in the shift register 31 to the final stage during the high-level period, thereby sequentially writing data. At this time, by the action of the data determining and shifting control circuit 32, only the bits corresponding to write data "0" are successively written while skipping the bits corresponding to write data "1". That is, every four bit lines in the memory arrays are selected and the write pulses are applied at timings as shown in FIGS. 11 and 12 in each group of the four bit lines.

In the case of the embodiment as well, by using a circuit having the configuration as shown in FIG. 13 as the circuit for generating the clocks $\phi1$ and $\phi2$ for controlling the data determining and shifting control circuit 32 and by using a circuit having the configuration as shown in FIG. 15 as the write pulse generating circuit for generating the write pulse Pw, the width of the write pulse can be changed or the number of overlap bits can be changed.

Figure 23:
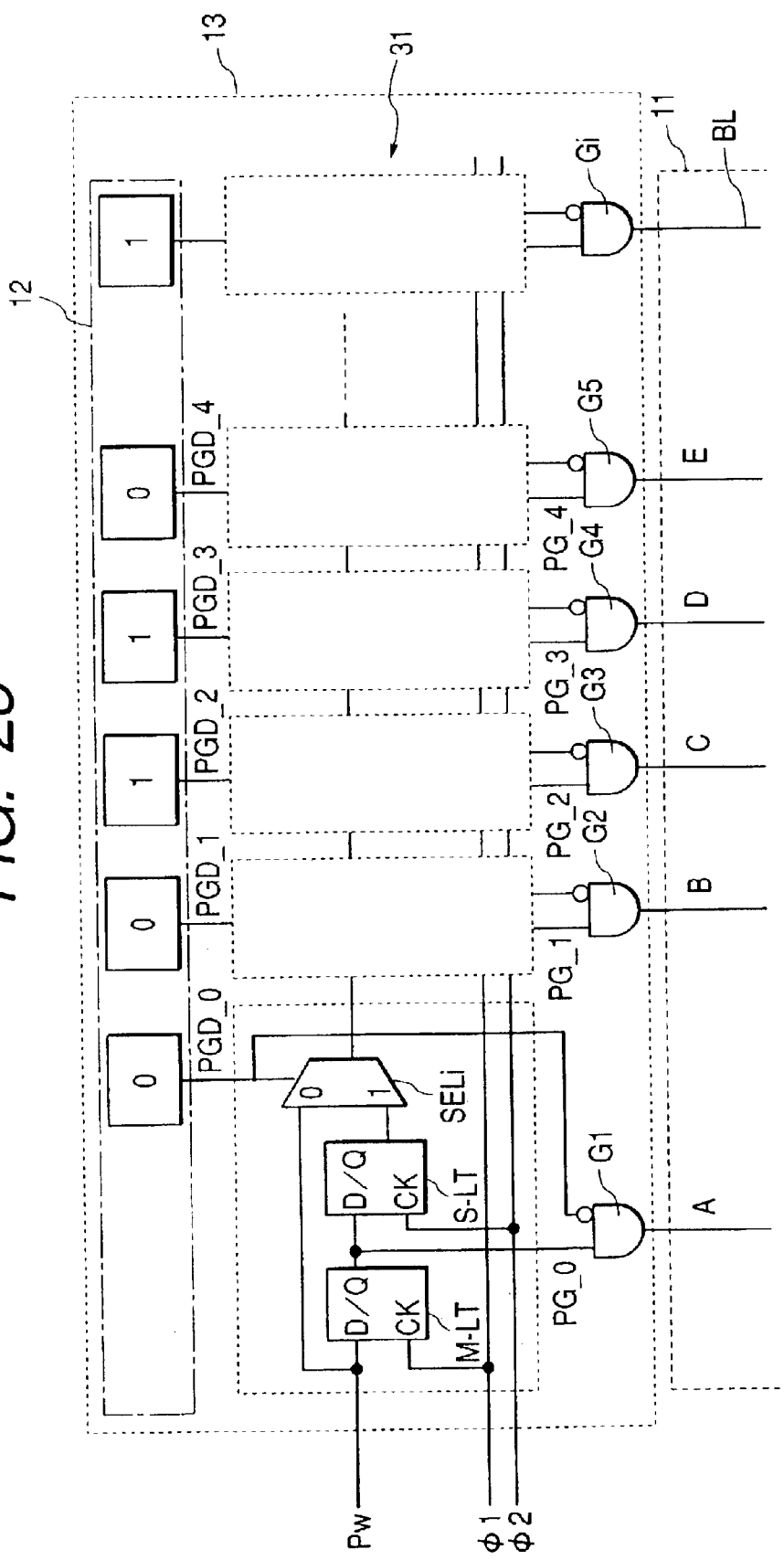
FIG. 23 is a circuit diagram showing further another concrete example of the write control circuit in the flash memory of the embodiment.

FIG. 23 shows further another embodiment of the write control circuit 13 in FIG. 2. In the write control circuit of the embodiment shown in FIG. 10, the data determining and shifting control circuit 32 selects either the bit "0" or "1" of the write data latched by the data register 12 and either the clock $\phi1$ or $\phi2$ in accordance with an output signal of the preceding stage, and allows the shift register 31 for shifting the write pulse Pw synchronously with the selected clock to perform the shifting operation, thereby generating successive write pulses A to I shifted every half cycle as shown in FIG. 12.

In contrast, in the write control circuit of the example of FIG. 23, the shift register 31 for shifting the write pulse Pw takes the form of a master-slave type flip flop constructed by a master latch M-LT and a slave latch S-LT, a through path for bypassing the inherent shift path, and a selection circuit SELi for selecting either the shift path or the through path are provided for each of stages in the shift register. The master latch M-LT and the slave latch S-LT are allowed to perform latching operation synchronously with the clocks $\phi1$ and $\phi2$, respectively, and the selection circuit SELi at each stage is controlled by a bit corresponding to the write data latched in the data register 12. When data of a bit is "0", the shift path is selected. When data of a bit is "1", the through path is selected. The write pulse latched by the master latch M-LT only in the case where data is "0" is applied to a corresponding bit line via the AND gate Gi.

Figure 24:
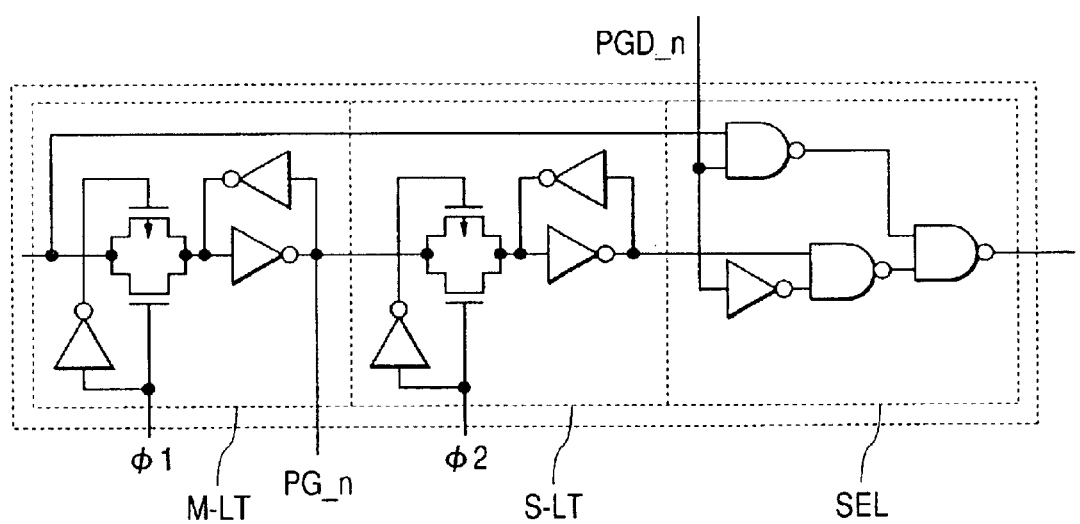
FIG. 24 is a circuit diagram showing a concrete example of a latch circuit and a selector circuit as components of the write control circuit of FIG. 23.

Also by using the write control circuit having the configuration as described above, the successive write pulses A to I sequentially shifted by half cycle as shown in FIG. 12 can be generated. In the embodiment as well, by using a circuit having the configuration as shown in FIG. 13 as the circuit for generating the clocks φ1 and φ2 for controlling the shift register 31 and by using a circuit having the configuration as shown in FIG. 15 as the write pulse generating circuit for generating the write pulse Pw, the width of the write pulse can be changed or the number of overlap bits can be changed. FIG. 24 shows a more concrete example of the master latch M-LT, slave latch S-LT, and selection circuit SELi. Since all the circuits of FIG. 24 are general circuits, the detailed configuration and operation will not be described.

Also in the embodiment of FIG. 23, in a manner similar to the embodiment of FIG. 21, by providing the first selection circuit (multiplexer) SEL1 between the shift register 31 and the data register 12, and by providing a second selection circuit (demultiplexer) SEL2 between the shift register 31 and a column of write amplifiers WA1, WA2, WA3, . . . , to share a shift stage in the shift register by the plurality of bits, thereby enabling the circuit scale to be reduced.

The invention achieved by the inventors herein has been specifically described above on the basis of the embodiments. However, the invention is not limited to the foregoing embodiments but, obviously, can be variously modified without departing from the gist. For example, in the write pulse generating circuit in FIG. 15, the clocks φ1 and φ2 and the write pulses Pw are interlocked with each other and the number of overlap bits of the write pulse is changed by the set values in the register 52. Alternately, it is also possible to change the number of overlap bits by changing the cycles of the clocks φ1 and φ2 by making the write pulse width constant without making the clocks φ1 and φ2 interlock with the write pulse Pw. In this case, the write pulse generating circuit can be constructed so as to change the cycles of the clocks φ1 and φ2 by the set value in the register 42 and change the write pulse width by the set value in the register 52.

Although the embodiments of the invention have been described above by using the writing operation as an example, the embodiments can be also carried out in the post erasure. In the case of the post erasure, the number of bits to be erased is small, so that reduction in the time by applying the invention is more effective.

The case where the invention is applied to what is called a DiNOR type flash memory in which drains of a plurality of memory cells are connected to a local drain line has been described in the embodiments. The invention can be also applied to what is called an NOR type flash memory in which a plurality of memory cells are connected in series, what is called an AND type flash memory in which sources and drains of a plurality of memory cells are connected to a local source line and a local drain line, respectively, and the like, and similar effects can be obtained.

Although the invention achieved by the inventors herein has been described with respect to the case where it is applied to a microcomputer having therein a flash memory as a field of use as a background, the invention is not limited to the microcomputer but can be widely applied to nonvolatile memories including a single flash memory.

Effects obtained by representative ones of the invention disclosed in the application will be briefly described as follows.

According to the invention, when the bit of write data has the logic "1" or "0", the bit is skipped, and the write voltage is sequentially applied only to bit lines corresponding to the logic "0" or "1". Consequently, the nonvolatile memory capable of shortening the write time as a total only by the write time of the bits corresponding to the write data of the logic "1" (or "0") and the microcomputer having therein the nonvolatile memory can be realized.

Since the data writing operation is performed in each of the cycles, that is, there is no cycle in which the writing operation is not performed, as compared with the conventional method, the fluctuations in the write current are small. Thus, the nonvolatile memory capable of performing stable writing operation with the suppressed fluctuations in the voltage generated by the booster circuit and the microcomputer having therein the nonvolatile memory can be realized.

What is claimed is:

1. A semiconductor device comprising a nonvolatile memory array and a central processing unit, wherein said nonvolatile memory array comprises a plurality of memory cells, a plurality of word lines, a plurality of data lines, and a control circuit, wherein each of said memory cells comprises a gate terminal, a first terminal and a second terminal, wherein each of said word lines is coupled to the gate terminals of corresponding ones of said memory cells, wherein each of said data lines is coupled to the first terminals of corresponding ones of said memory cells, wherein said central processing unit is capable of instructing a program operation to said nonvolatile memory array, and wherein in said program operation, said control circuit of said nonvolatile memory array selects one word line, supplies a program voltage to the selected word line, and supplies a first voltage for a first duration of time to a first data line coupled to a first memory cell to be subjected to programming, and supplies the first voltage for a second duration of time to a second data line coupled to a second memory cell to be subjected to programming after the start of supplying the first voltage to the first data line and before the completion of the first duration of time, regardless of whether one or more memory cells not to be subjected to programming are coupled to the selected word line between the first memory cell and the second memory cell.

2. A semiconductor device according to claim 1, wherein said first duration of time is shorter than said second duration of time.

3. A semiconductor device according to claim 2, wherein said nonvolatile memory array receives a clock signal, and wherein said first duration of time and said second duration of time are based on said clock signal.

4. A semiconductor device according to claim 1, wherein said central processing unit is further capable of instructing a verify operation to said nonvolatile memory array.

5. A semiconductor device according to claim 4, wherein said control circuit of said nonvolatile memory array is capable of conducting another program operation when it is found by said verify operation that programming of one or more memory cells is not completed.

6. A semiconductor device according to claim 1, wherein said nonvolatile memory array comprises a data buffer including a plurality of buffer cells, and wherein said data buffer is capable of storing data for programming to said memory cells.

7. A semiconductor device according to claim 6,
wherein each of said buffer cells is coupled to a corresponding data line and is capable of storing one of a first state and a second state,
wherein for a memory cell to be subjected to programming, a corresponding buffer cell has said first state stored therein, and
wherein for a memory cell not to be subjected to programming, a corresponding buffer cell has said second state stored therein.

8. A semiconductor device according to claim 1,
wherein said second terminals of respective memory cells coupled to a same word line are coupled to each other.

9. A semiconductor device according to claim 1,
wherein said memory cells to be subjected to programming include said first memory cell, said second memory cell and a third memory cell,
wherein said one or more memory cells not to be subjected to programming include a fourth memory cell,
wherein said third memory cell is arranged next to said second memory cell and said fourth memory cell is arranged between said first memory cell and said second memory cell, and
wherein a supply of said first voltage to a third the data line coupled to said third memory cell is started after said supply of said first voltage to said second data line coupled to said second memory cell is started.

* * * * *